(12) United States Patent
Han et al.

(10) Patent No.: US 12,040,231 B2
(45) Date of Patent: Jul. 16, 2024

(54) SEMICONDUCTOR DEVICE INCLUDING TSV AND MULTIPLE INSULATING LAYERS

(71) Applicant: Samsung Electronics Co., Ltd., Suwon-si (KR)

(72) Inventors: Junghoon Han, Hwaseong-si (KR); Juik Lee, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 75 days.

(21) Appl. No.: 17/201,457

(22) Filed: Mar. 15, 2021

(65) Prior Publication Data
US 2022/0084885 A1    Mar. 17, 2022

(30) Foreign Application Priority Data
Sep. 17, 2020 (KR) .................. 10-2020-0119642

(51) Int. Cl.
*H01L 21/768* (2006.01)
*H01L 23/31* (2006.01)
*H01L 23/48* (2006.01)
*H01L 23/528* (2006.01)

(52) U.S. Cl.
CPC .... *H01L 21/76898* (2013.01); *H01L 21/7682* (2013.01); *H01L 21/76831* (2013.01); *H01L 23/3171* (2013.01); *H01L 23/3192* (2013.01); *H01L 23/481* (2013.01); *H01L 23/528* (2013.01)

(58) Field of Classification Search
CPC ............. H01L 23/481; H01L 21/76898; H01L 21/7682; H01L 25/0657; H01L 2224/16145; H01L 21/76831; H01L 23/3171; H01L 23/3192

USPC ............... 257/621, 774, E21.597, E23.011, 257/E23.067; 438/424, 667, 675

See application file for complete search history.

(56) References Cited

U.S. PATENT DOCUMENTS

| | | |
|---|---|---|
| 7,868,455 B2 | 1/2011 | Chen |
| 8,647,920 B2 | 2/2014 | Tezcan et al. |
| 8,877,559 B2 | 11/2014 | Gao et al. |
| 9,064,940 B2 | 6/2015 | Chen |
| 9,425,127 B2 | 8/2016 | Yu et al. |
| 9,786,581 B2 | 10/2017 | Kamgaing |
| 10,515,892 B2 | 12/2019 | Bu et al. |
| 10,651,122 B1 * | 5/2020 | Bao .................. H01L 21/76897 |

(Continued)

FOREIGN PATENT DOCUMENTS

KR    10-2012-0094712 A    8/2012

*Primary Examiner* — David Chen
(74) *Attorney, Agent, or Firm* — Harness, Dickey & Pierce, P.L.C.

(57) ABSTRACT

A semiconductor device includes a substrate, an interlayer insulating layer covering an upper surface of the substrate, an individual device in the interlayer insulating layer, a lower insulating layer covering a lower surface of the substrate, a through-silicon-via (TSV) structure extending through the substrate, the interlayer insulating layer and the lower insulating layer, a conductive pad connected to an upper end of the TSV structure, a via insulating layer surrounding the TSV structure, a capping insulating layer surrounding the TSV structure outside the via insulating layer. The via insulating layer and the capping insulating layer have an air gap therebetween. A portion of the air gap extends into the lower insulating layer.

15 Claims, 23 Drawing Sheets

(56) References Cited

U.S. PATENT DOCUMENTS

| | | | |
|---|---|---|---|
| 2010/0164062 A1* | 7/2010 | Wang | H01L 27/0629 |
| | | | 257/532 |
| 2011/0215477 A1* | 9/2011 | Chen | H01L 23/522 |
| | | | 438/618 |
| 2012/0139115 A1 | 6/2012 | You et al. | |
| 2012/0142185 A1* | 6/2012 | Park | H01L 21/76898 |
| | | | 257/E21.586 |
| 2012/0211885 A1 | 8/2012 | Choi et al. | |
| 2012/0292746 A1* | 11/2012 | Lee | H01L 21/76898 |
| | | | 257/621 |
| 2012/0292782 A1* | 11/2012 | Lee | H01L 23/481 |
| | | | 257/774 |
| 2013/0020719 A1* | 1/2013 | Jung | H01L 23/481 |
| | | | 257/774 |
| 2015/0028494 A1* | 1/2015 | Park | H01L 21/76831 |
| | | | 257/774 |
| 2015/0287680 A1* | 10/2015 | Jin | H01L 23/5329 |
| | | | 257/751 |
| 2018/0019187 A1* | 1/2018 | Lagouge | H01L 21/2885 |
| 2019/0221475 A1* | 7/2019 | Hong | H01L 21/7682 |
| 2020/0006130 A1 | 1/2020 | Chang et al. | |
| 2020/0105867 A1* | 4/2020 | Lee | H01L 29/0649 |

\* cited by examiner

SEMICONDUCTOR DEVICE INCLUDING TSV AND MULTIPLE INSULATING LAYERS

CROSS-REFERENCE TO THE RELATED APPLICATION

This application claims priority from Korean Patent Application No. 10-2020-0119642, filed on Sep. 17, 2020, in the Korean Intellectual Property Office, the disclosure of which is incorporated herein by reference in its entirety.

BACKGROUND

Some example embodiments of inventive concepts relate to a semiconductor device including a through-silicon via (TSV) and/or a method for fabricating/manufacturing the same.

As recent semiconductor technology, through-silicon via (TSV) technology in which a TSV extends through the entirety of a semiconductor substrate is used, in place of/instead of/in addition to bonding wire technology. Such TSV technology greatly reduces a physical distance, as compared to existing bonding wire technology and, as such, greatly contributes to an enhancement in communication speed between semiconductor chips.

Such a TSV must be gradually reduced in accordance with down-scaling and/or integration enhancement of a semiconductor device. As a result, an insulating film surrounding the TSV also becomes thinner, thereby causing degradation in insulation characteristics between a semiconductor substrate and the TSV, which may damage to the insulating film and/or cause degradation of the insulating film.

SUMMARY

Some example embodiments of inventive concepts provide a semiconductor device including a through-silicon via (TSV) having excellent insulation characteristics and excellent electrical characteristics, and/or a method for fabricating/manufacturing the same.

A method for manufacturing a semiconductor device in accordance with some example embodiments of inventive concepts includes forming, on an upper surface of a substrate, a front-end-of-line (FEOL) structure including an individual device and an interlayer insulating layer, forming a through hole extending through the substrate and the interlayer insulating layer, forming a via insulating layer covering an inner side wall of the substrate exposed through the through hole and covering an inner bottom surface of the substrate exposed through the through hole, forming, in the through hole, a sacrificial insulating layer covering the via insulating layer, forming, in the through hole, a capping insulating layer covering the sacrificial insulating layer, forming, in the through hole, a barrier layer covering the capping insulating layer, forming, on the barrier layer, a through-silicon-via (TSV) filling the through hole, partially removing the substrate from a lower surface of the substrate to have lower portions of the via insulating layer, lower portions of the sacrificial insulating layer, lower portions of the capping insulating layer, lower portions of the barrier layer, and lower portion of the TSV protruding from the lower surface of the substrate, partially removing the via insulating layer to expose the sacrificial insulating layer, removing the sacrificial insulating layer to form a trench between the via insulating layer and the capping insulating layer, and forming, on the lower surface of the substrate, a lower insulating layer sealing the trench to form an air gap.

A semiconductor device according to some example embodiments of inventive concepts includes an interlayer insulating layer covering an upper surface of a substrate, an individual device in the interlayer insulating layer, a lower insulating layer covering a lower surface of the substrate, a through-silicon-via (TSV) structure extending through the substrate, extending through the interlayer insulating layer, and extending through the lower insulating layer, a conductive pad connected to an upper end of the TSV structure, a via insulating layer surrounding the TSV structure, a capping insulating layer surrounding the TSV structure outside the via insulating layer with the via insulating layer and the capping insulating layer having an air gap therebetween. A portion of the air gap extends into the lower insulating layer.

A semiconductor device according to some example embodiments of inventive concepts includes an interlayer insulating layer covering an upper surface of a substrate, an individual device in the interlayer insulating layer, a lower insulating layer covering a lower surface of the substrate, a through-silicon-via (TSV) structure extending through the substrate, extending through the interlayer insulating layer, and extending through the lower insulating layer, a conductive pad connected to an upper end of the TSV structure, a via insulating layer surrounding the TSV structure, a capping insulating layer surrounding the TSV structure, the capping insulating layer outside the via insulating layer, an intermediate insulating layer between the via insulating layer and the capping insulating layer. The via insulating layer and the intermediate insulating layer having a first air gap therebetween. The intermediate insulating layer and the capping insulating layer having a second air gap therebetween. Vertical lengths of the first air gap and the second air gap are different.

DETAILED DESCRIPTION OF SOME EXAMPLE EMBODIMENTS

Figure 1A:
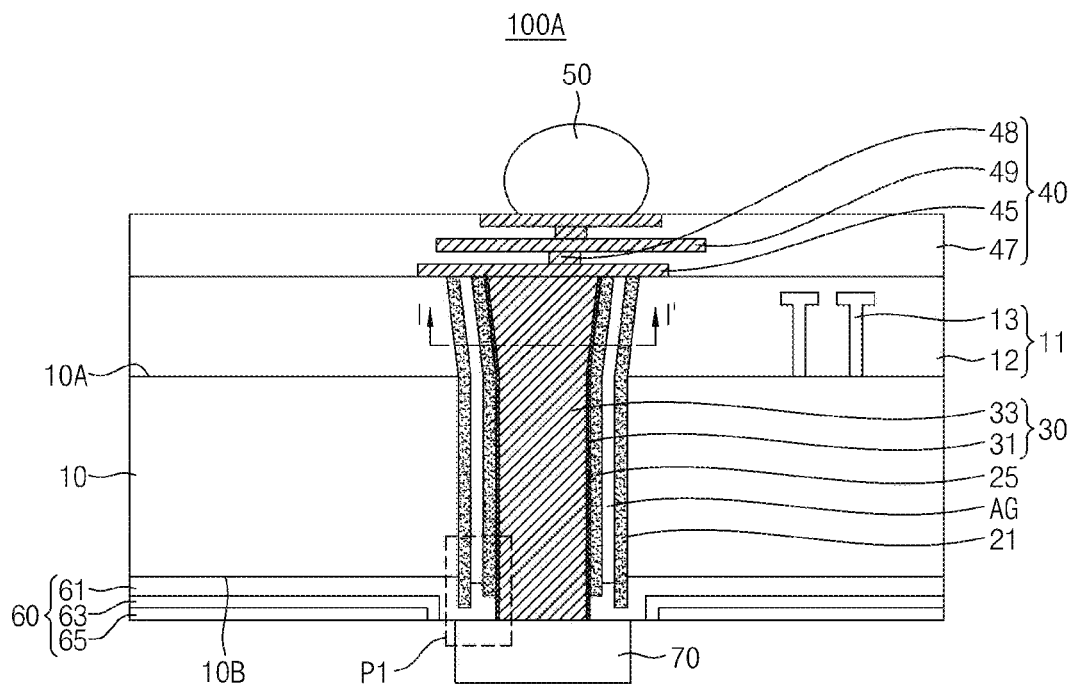
FIG. 1A is a sectional view of a semiconductor device according some example embodiments of inventive concepts.
Figure 1B:
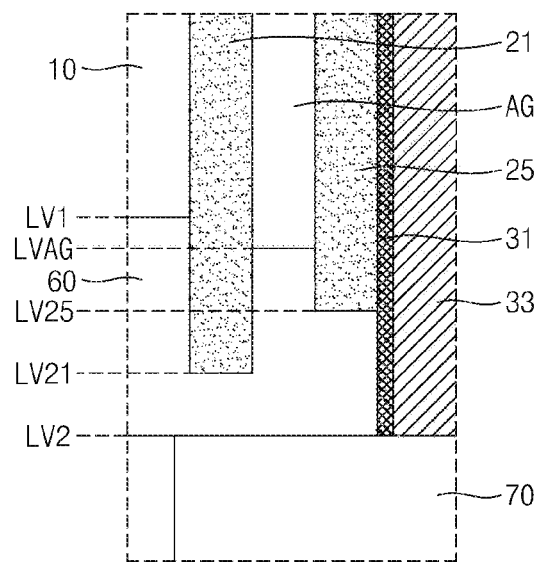
FIG. 1B is an enlarged view of a region P1 in FIG. 1A.
Figure 2:
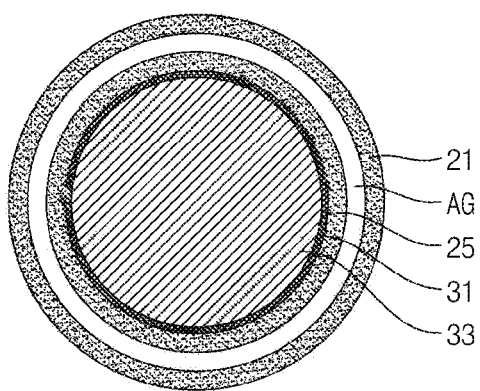
FIG. 2 is a cross-sectional view taken along line I-I' in FIG. 1A.

FIG. 1A is a sectional view of a semiconductor device according to some example embodiments of inventive concepts. FIG. 1B is an enlarged view of a region P1 in FIG. 1A. FIG. 2 is a cross-sectional view taken along line I-I' in FIG. 1A.

Referring to FIGS. 1A, 1B and 2, a semiconductor device 100A may include a substrate 10, a front-end-of-line (FEOL) structure 11, a lower insulating layer 60, a through-silicon via (TSV) structure 30, a via insulating layer 21, a capping layer 25, an air gap AG, a wiring layer 40, and a connecting terminal 50.

The substrate 10 may be or include a semiconductor substrate such as, but not limited to a silicon substrate, a silicon-germanium wafer, a III-V substrate, a silicon-on-insulator substrate, etc. The substrate 10 may be or correspond to a wafer, and may be undoped or lightly doped, e.g. may be lightly doped with P-type impurities. Further the substrate 10 may include an upper surface 10A, which is an active surface, and a lower surface 10B, which is an inactive surface. The FEOL structure 11, which includes an interlayer insulating layer 12 and individual devices 13, may be disposed at the upper surface 10A of the substrate 10. A plurality of individual devices ID having various kinds may be disposed in the interlayer insulating layer 12. The individual devices ID may include various microelectronic devices, for example, a metal-oxide-semiconductor field effect transistor (MOSFET), a system large scale integration (LSI), an image sensor such as a CMOS imaging sensor (CIS), a microelectromechanical system (MEMS), an active device such as a diode such as a light-emitting diode, a passive device such as a resistor and/or a capacitor, etc. The individual devices ID may be electrically connected to a conductive region of the substrate 10. Alternatively or additionally, neighboring ones of the individual devices ID may be electrically isolated from one another by the interlayer insulating layer 12.

The TSV structure 30 may extend through the substrate 10 and the interlayer insulating layer 12. A lower portion of the TSV structure 30 may partially protrude from the lower surface 10B of the substrate 10. The TSV structure 30 may include a TSV 33 and a barrier layer 31. The TSV 33 may be a cylindrical pillar shape. The TSV 33 may include Cu and/or W. For example, the TSV 33 may be made of or may include Cu, CuSn, CuMg, CuNi, CuZn, CuPd, CuAu, CuW, W, or a W alloy, without being limited thereto. The diameter of the TSV 33 may be about 3 to 10 μm, for example 3 μm, 4 μm, 5 μm, 6 μm, 7 μm, 8 μm, 9 μm, or 10 μm, without being limited thereto. The barrier layer 31 may surround a side wall of the TSV 33. The barrier layer 31 may be a conductive layer having relatively low wiring resistance/resistivity. For example, the barrier layer 31 may be a single-layer film or a multilayer film including at least one of W, WN, Ti, TiN, Ta, TaN and Ru. For example, the barrier layer 31 may be constituted by/may correspond to a multilayer film made of at least one of TaN/W, TiN/W or WN/W.

The lower insulating layer 60 may be disposed on the lower surface 10B of the substrate 10. The lower insulating layer 60 may surround a portion of the TSV structure 30 protruding from the lower surface 10B of the substrate 10. The lower insulating layer 60 may cover a portion of the barrier layer 31. The lower insulating layer 60 may include a first lower insulating layer 61, a second lower insulating layer 63, and a third lower insulating layer 65. The first lower insulating layer 61 may cover the lower surface 10B of the substrate 10. The second lower insulating layer 63 may be disposed between the first lower insulating layer 61 and the third lower insulating layer 65. The first lower insulating layer 61 and the third lower insulating layer 65 may include, e.g. may consist of, the same material or the same materials. For example, the first lower insulating layer 61 and the third lower insulating layer 65 may both include silicon oxide. The second lower insulating layer 63 may include silicon nitride.

The via insulating layer 21 may be disposed between the substrate 10 and the TSV structure 30 and between the interlayer insulating layer 12 and the TSV structure 30. The via insulating layer 21 may contact an inner side wall of the substrate 10 while contacting an inner side wall of the interlayer insulating layer 12. The via insulating layer 21 may be spaced apart from the TSV structure 30. The via insulating layer 21 may have a cylindrical shape, e.g. a hollow cylindrical shape. The via insulating layer 21 may be spaced apart from the capping insulating layer 25 such that the via insulating layer 21 may surround the capping insulating layer 25 and the TSV structure 30. A portion of the via insulating layer 21 may protrude from the lower surface 10B of the substrate 10. A lower portion of the insulating layer 21 may partially extend into the lower insulating layer 60. A level LV21 of a lower end of the insulating layer 21 may be lower than a level LV1 of the lower surface 10B of the substrate 10, but higher than a level LV2 of a lower end of the TSV structure 30.

The via insulating layer 21 may include an oxide. For example, the oxide included in the via insulating layer 21 may include at least one of tetraethylorthosilicate (TEOS), high-density plasma (HDP), borophosphosilicate glass (BPSG), and a flowable chemical vapor deposition (FCVD) oxide, and may be formed with a chemical vapor deposition (CVD) process such as a plasma-enhanced CVD (PECVD) process and/or a low pressure CVD (LPCVD) process, without being limited thereto.

In some example embodiments, the via insulating layer 21 may include a nitride and/or low-k dielectrics. For example, the nitride included in the via insulating layer 21 may be constituted by/correspond to at least one of SiN or SiON. For example, the low-k dielectrics included in the via insulating layer 21 may be constituted by/correspond to an ultralow-k (ULK) film having an ultralow dielectric constant K of 2.2 to 2.4. For example, the ULK film may be made of SiOC or SiCOH. However, example embodiments are not limited to the above-described examples.

The capping insulating layer 25 may be disposed between the via insulating layer 21 and the TSV structure 30. The capping insulating layer 25 may have a cylindrical shape, e.g. a hollow cylindrical shape. The capping insulating layer 25 may surround the TSV structure 30 while covering an outer side surface of the barrier layer 31. A lower portion of the capping layer 25 may partially extend into the lower insulating layer 60. A level LV25 of a lower end of the capping layer 25 may be lower than the level LV1 of the lower surface 10B of the substrate 10, but higher than the level LV2 of the lower end of the TSV structure 30. As such, the capping layer 25 may not cover a part of the lower portion of the TSV structure 30. The level LV25 of the lower end of the capping layer 25 may be equal to or different from the level LV21 of the lower end of the via insulating layer 21. In some example embodiments, the level LV25 of the lower end of the capping insulating layer 25 may be lower than the level LV21 of the lower end of the via insulating layer 21. The capping insulating layer 25 may include, e.g. may consist of, the same material or the same materials as the via insulating layer 21.

The air gap AG may be formed between the via insulating layer 21 and the capping insulating layer 25. The via insulating layer 21 and the capping insulating layer 25 may be spaced apart from each other by the air gap AG. The air gap AG may be defined by the via insulating layer 21, the capping insulating layer 25, the wiring layer 40 and the lower insulating layer 60. An upper end of the air gap AG may be defined by a conductive pad 45 of the wiring layer 40, and a lower end of the air gap AG may be defined by the lower insulating layer 60.

In some example embodiments, the air gap AG may extend into the lower insulating layer 60. A portion of the lower insulating layer 60 may extend between the via insulating layer 21 and the capping insulating layer 25 such that a seal may be formed between the via insulating layer 21 and the capping insulating layer 25, thereby defining the lower end of the air gap AG. A level LVAG of the lower end of the air gap AG may be lower than the level LV1 of the lower surface 10B of the substrate 10. The level LVAG of the lower end of the air gap AG may be positioned between the level LV1 of the lower surface 10B of the substrate 10 and the level LV2 of the lower end of the TSV structure 30. The level LVAG of the lower end of the air gap AG may be higher than the level LV21 of the lower end of the via insulating layer 21 and the level LV25 of the lower end of the capping insulating layer 25.

The wiring layer 40 may be disposed on an upper surface of the interlayer insulating layer 12. The wiring layer 40 may also correspond to/be referred to as a "back-end-of-line (BEOL) structure". The wiring layer 40 may include the conductive pad 45, a short via 48, a wiring pattern 49, and an upper insulating layer 47. The conductive pad 45 may vertically overlap with the TSV structure 30. The conductive pad 45 may be directly connected to the TSV structure 30. For example, a lower surface of the conductive pad 45 may contact upper ends of the TSV 33 and the barrier layer 31. A lower surface of the conductive pad 45 may contact upper ends of the via insulating layer 21 and the capping insulating layer 25. The lower surface of the conductive pad 45 may define the upper end of the air gap AG.

The short via 48 and the wiring pattern 49 may be stacked on the conductive pad 45. The short via 48 may electrically connect the conductive pad 45 and the wiring pattern 49 to each other between the wiring pattern 49 and the conductive pad 45. In addition, the via 48 may electrically connect wiring patterns 49 vertically spaced apart from each other between the wiring patterns 49. The conductive pad 45 and the connecting terminal 50 may be electrically connected to each other through the wiring pattern 49 and the short via 48. In addition, the wiring pattern 49 and the short via 48 may be used to electrically connect the individual devices 13 to external devices. The short via 48 and the wiring pattern 49 may include a metal such as at least one of Cu, Al, or W and may or may not include the same material.

The upper insulating layer 47 may cover surfaces of the conductive pad 45, the short via 48, and the wiring pattern 49 on the interlay insulating layer 12. The upper insulating layer 47 may lead to/may function to space two or more wiring patterns 49 from each other. Although the upper insulating layer 47 is shown as having a single-layer structure in the drawings, the upper insulating layer 47 may be formed to have a multilayer structure. For example, the upper insulating layer 47 may include at least one of silicon oxide and silicon nitride.

Figure 3A:
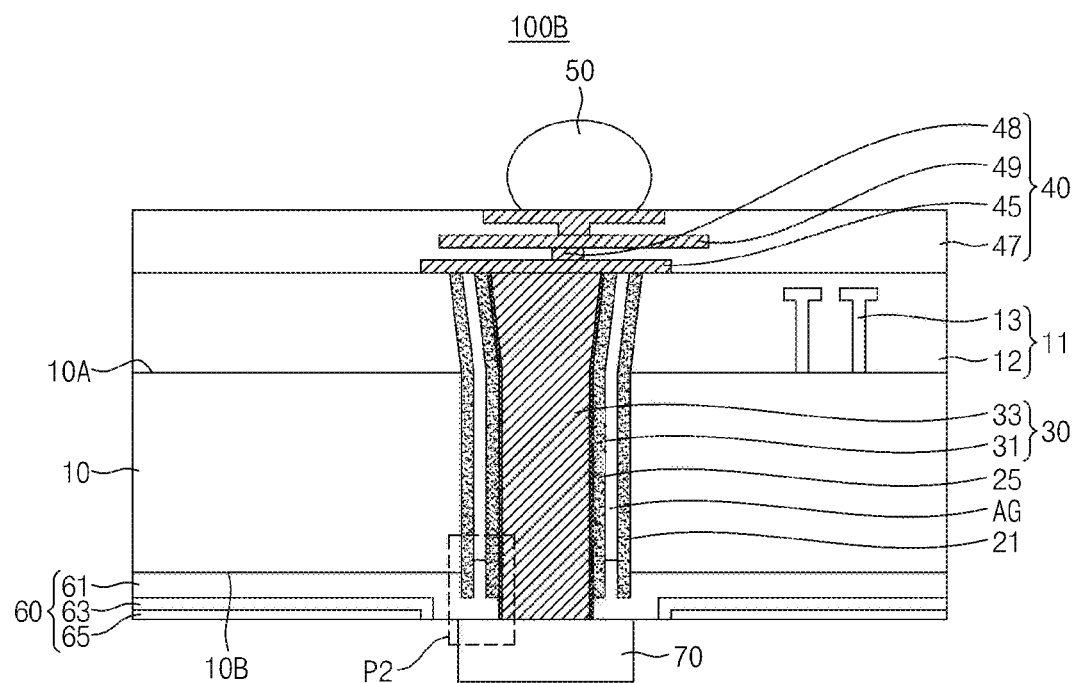
FIG. 3A is a sectional view of a semiconductor device according to some example embodiments of inventive concepts.
Figure 3B:
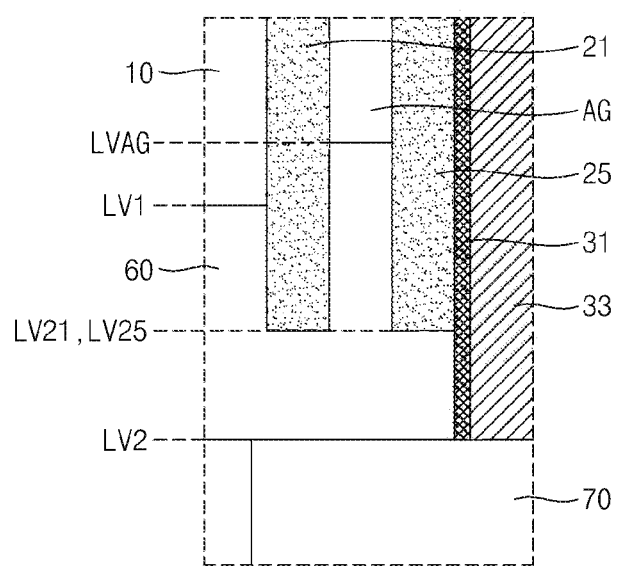
FIG. 3B is an enlarged view of a region P2 in FIG. 3A.

FIG. 3A is a sectional view of a semiconductor device according to some example embodiments of inventive concepts. FIG. 3B is an enlarged view of a region P2 in FIG. 3A.

Referring to FIGS. 3A and 3B, in some example embodiments, a portion of a lower insulating layer 60 included in a semiconductor device 100B may extend between a via insulating layer 21 and a capping insulating layer 25 such that a level LVAG of an upper end of the extending portion may be higher than a level LV1 of a lower surface 10B of a substrate 10. In some example embodiments, levels LV21 and LV25 of lower ends of the via insulating layer 21 and the capping insulating layer 25 may be equal within the lower insulating layer 60.

Figure 4A:
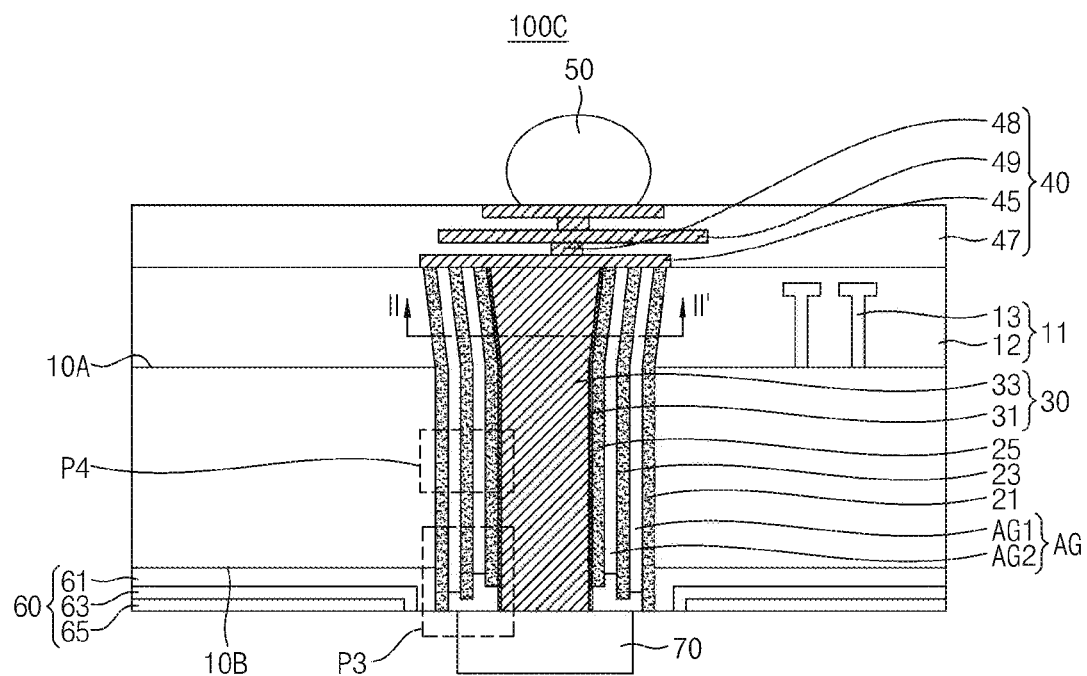
FIG. 4A is a sectional view of a semiconductor device according to some example embodiments of inventive concepts.
Figure 4B:
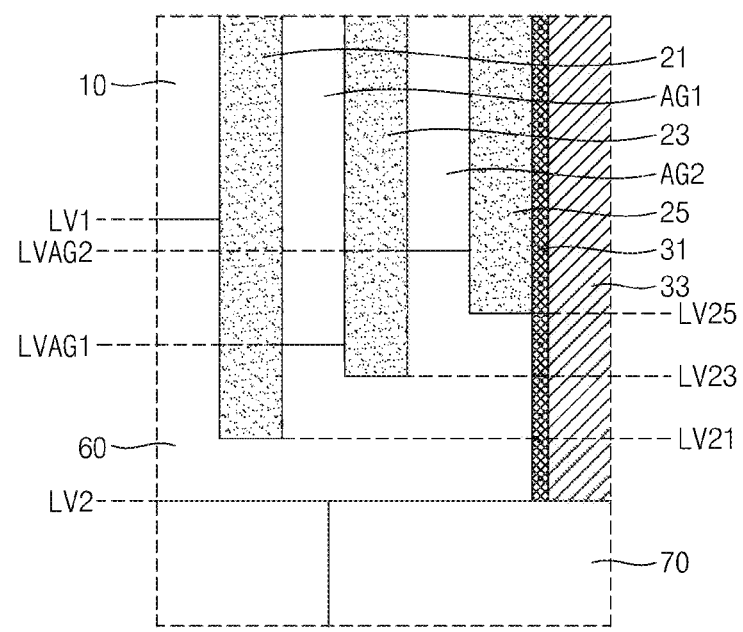
FIG. 4B is an enlarged view of a region P3 in FIG. 4A.
Figure 5:
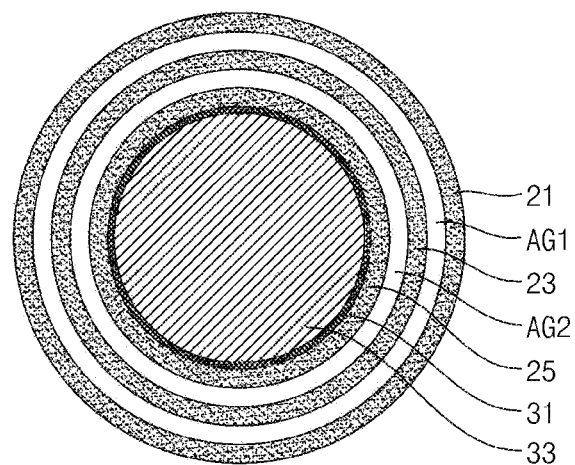
FIG. 5 is a cross-sectional view taken along line II-II' in FIG. 4A.
Figure 6A:
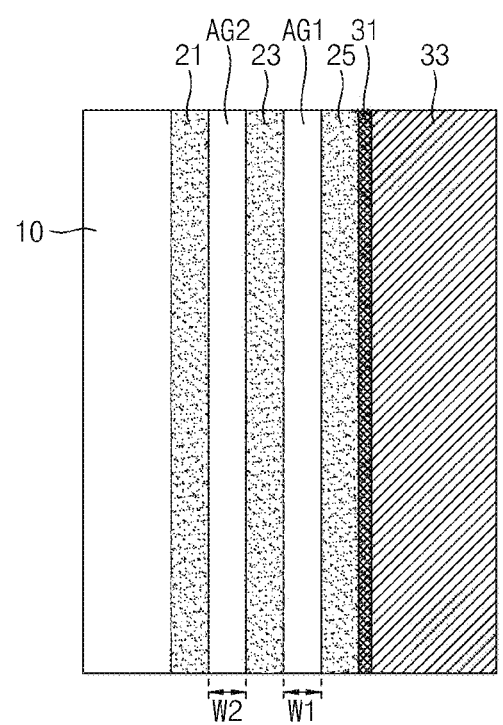
FIGS. 6A, 6B, and 6C are enlarged views of regions P4 according to example embodiments of FIG. 4A.
Figure 6B:
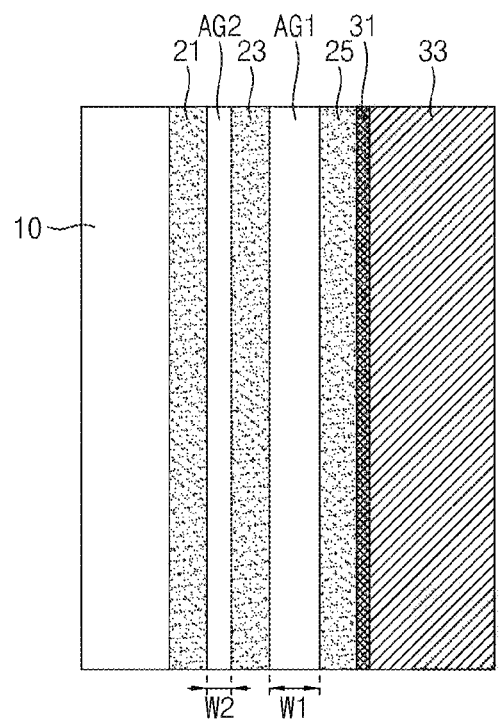
Figure 6C:
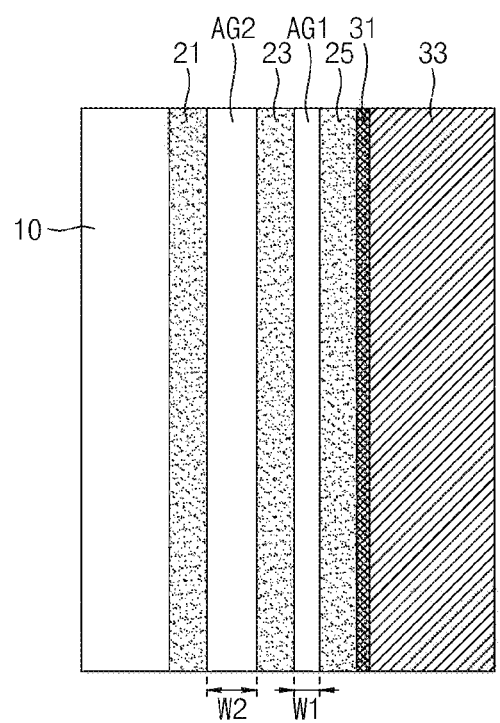

FIG. 4A is a sectional view of a semiconductor device according to some example embodiments of the disclosure. FIG. 4B is an enlarged view of a region P3 in FIG. 4A. FIG. 5 is a cross-sectional view taken along line II-II' in FIG. 4A. FIGS. 6A, 6B, and 6C are enlarged views of regions P4 according to embodiments of FIG. 4A.

Referring to FIGS. 4A, 4B and 5, a semiconductor device 100C may further include an interlayer insulating layer 23 between an intermediate insulating layer 23 between a via insulating layer 21 and a capping insulating layer 25. An air gap AG may include an outer air gap AG1 formed between the via insulating layer 21 and the intermediate insulating layer 23, and an inner air gap AG2 formed between the intermediate insulating layer 23 and the capping insulating layer 25. Either or both of the outer air gap AG1 and the inner air gap AG2 may be formed of or may include air such as clean, dry air (CDA) and/or may be in vacuum; however, inventive concepts are not limited thereto. A dielectric constant of the outer air gap AG1 and/or the inner air gap AG2 may be about 1.0 and may be the same, or different from, each other; however, example embodiments are not limited thereto.

The intermediate insulating layer 23 may be disposed inside the via insulating layer 21. The interlayer insulating layer 23 may have a cylindrical shape, e.g. may have a hollow cylindrical shape. The interlayer insulating layer 23 may surround the capping insulating layer 25 outside the capping insulating layer 25. The interlayer insulating layer 23 may be spaced apart from the via insulating layer 21 and the capping insulating layer 25. A lower portion of the interlayer insulating layer 23 may partially extend into a lower insulating layer 60. A level LV23 of a lower end of the intermediate insulating layer 23 may be positioned between a level LV1 of a lower surface 10B of a substrate 10 and a level LV2 of a lower end of a TSV structure 30. The thickness of the intermediate insulating layer 23 may be equal to or different from the thickness of the via insulating layer 21 and/or may be equal to or different from the thickness of the capping insulating layer 25. The intermediate insulating layer 23 may include, e.g. may consist of, the same material or the same materials as the via insulating layer 21 and the capping insulating layer 25.

In some example embodiments, levels LV21, LV23 and LV25 of lower ends of the via insulating layer 21, the intermediate insulating layer 23, and the capping insulating layer 25 may be different, e.g. at different levels. For example, the level LV21 of the lower end of the via insulating layer 21 may be lowest, the level LV25 of the lower end of the capping insulating layer 25 may be highest, and the lower end of the intermediate insulating layer 23 may be disposed between the lower end of the via insulating layer 21 and the lower end of the capping insulating layer 25.

The outer air gap AG1 may be defined by the intermediate insulating layer 23, the via insulating layer 21, the lower insulating layer 60, and a wiring layer 40. A portion of the lower insulating layer 60 may extend between the via insulating layer 21 and the intermediate insulating layer 23 to seal the outer air gap AG1 and, as such, may define a lower end of the outer air gap AG1. A level LVAG1 of the lower end of the outer air gap AG1 may be positioned between the level LV1 of the lower surface 10B of the substrate 10 and the level LV2 of the lower end of the TSV structure 30. The level LVAG1 of the lower end of the outer air gap AG1 may be higher than the levels of either or both of LV21 and LV23 of the lower ends of the via insulating layer 21 and the intermediate insulating layer 23. The level LVAG1 of the lower end of the outer air gap AG1 may be lower than the level LV25 of the lower end of the capping insulating layer 25; however, example embodiments are not limited thereto.

The inner air gap AG2 may be defined by the intermediate insulating layer 23, the capping insulating layer 25, the lower insulating layer 60, and the wiring layer 40. A portion of the lower insulating layer 60 may extend between the intermediate insulating layer 23 and the capping insulating layer 25 to seal the inner air gap AG2 and, as such, may define a lower end of the inner air gap AG2. A level LVAG2 of an upper end of the portion of the lower insulating layer 60 extending between the intermediate insulating layer 23 and the capping insulating layer 25 may differ from a level LVAG1 of an upper end of the portion of the lower insulating layer 60 extending between the intermediate insulating layer 23 and the via insulating layer 21. As such, the level LVAG1 of the lower end of the outer air gap AG1 may differ from the level LVAG2 of the lower end of the inner air gap AG2, and a vertical length of the outer air gap AG1 may differ from a vertical length of the inner air gap AG2. For example, the level LVAG1 of the lower end of the outer air gap AG1 may be lower than the level LVAG2 of the lower end of the inner air gap AG2. For example, the vertical length of the outer air gap AG1 may be greater than the vertical length of the inner air gap AG2.

Although not shown, in some example embodiments, the levels of the lower ends of each of or at least two of the via insulating layer 21, the intermediate insulating layer 23, and the capping insulating layer 25 may be equal. The level of the upper end of the lower insulating layer 60 extending between the intermediate insulating layer 23 and the capping insulating layer 25 may be equal to the level of the upper end of the portion of the lower insulating layer 60 extending between the intermediate insulating layer 23 and the via insulating layer 21. As such, the level of the lower end of the inner air gap AG2 may be equal to the level of the lower end of the outer air gap AG1. For example, the vertical length of the outer air gap AG1 may be equal to the vertical length of the inner air gap AG2.

Referring to FIG. 6A, in some example embodiments, horizontal widths W1 and W2 of the inner air gap AG2 and the outer air gap AG1 may be substantially equal. Referring to FIGS. 6B and 6C, in some example embodiments, the horizontal width W1 of the outer air gap AG1 may differ from the horizontal width W2 of the inner air gap AG2. Referring to FIG. 6B, for example, the horizontal width W2 of the inner air gap AG2 may be less than the horizontal width W1 of the outer air gap AG1. Referring to FIG. 6C, for example, the horizontal width W2 of the inner air gap AG2 may be greater than the horizontal width W1 of the outer air gap AG1.

Figure 7A:
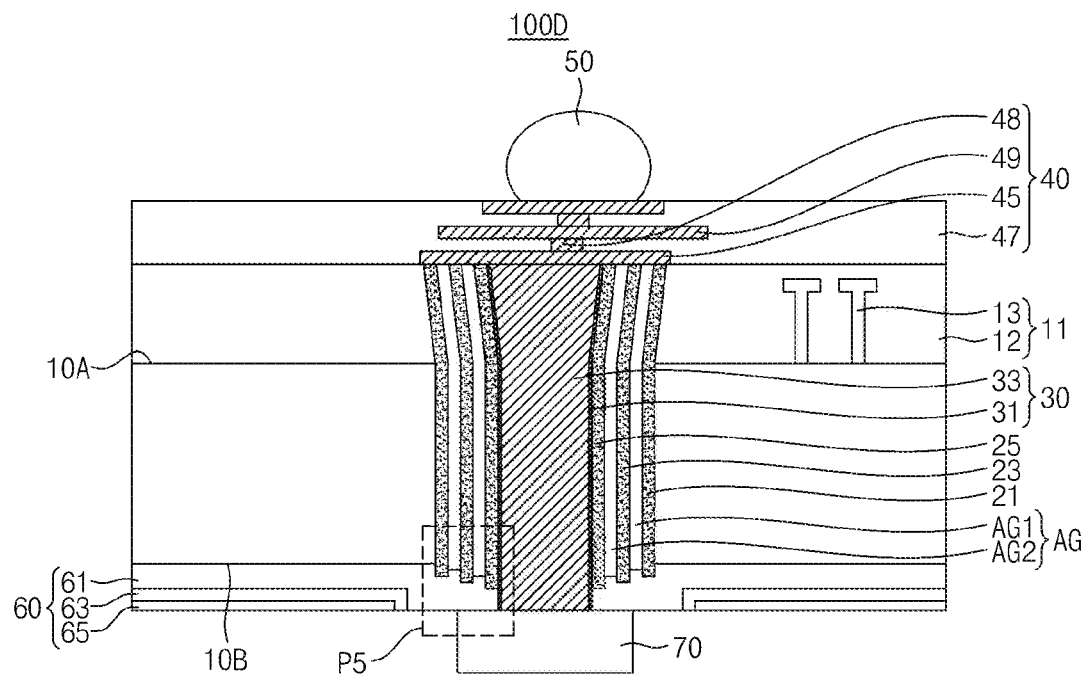
FIG. 7A is a sectional view of a semiconductor device according to some example embodiments of inventive concepts.
Figure 7B:
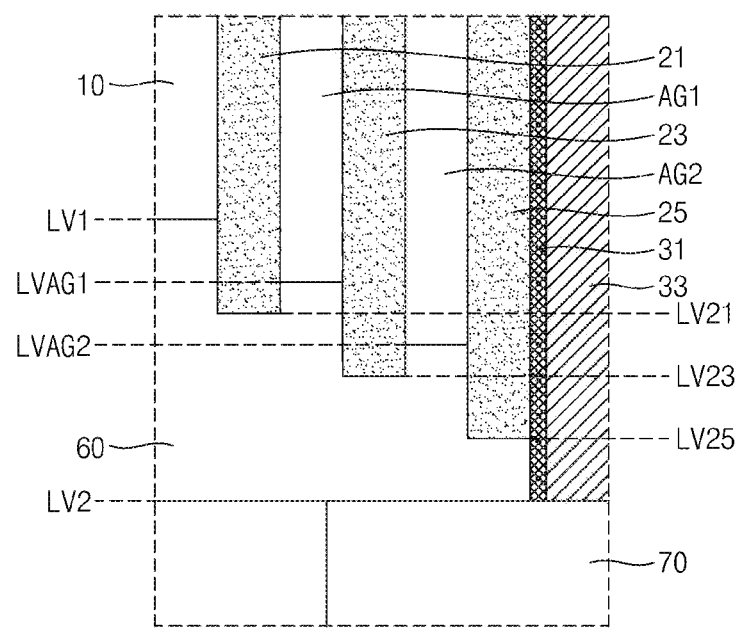
FIG. 7B is an enlarged view of a region P5 in FIG. 7A.

FIG. 7A is a sectional view of a semiconductor device according to some example embodiments of inventive concepts. FIG. 7B is an enlarged view of a region P5 in FIG. 7A.

Referring to FIGS. 7A and 7B, vertical lengths of a via insulating layer 21, an intermediate insulating layer 23, and a capping insulating layer 25, which are included in a semiconductor device 100D, may be different. For example, levels LV21, LV23 and LV25 of lower ends of the via insulating layer 21, the intermediate insulating layer 23, and the capping layer 25 may each be different from one another. In some example embodiments, the level LV21 of the lower end of the via insulating layer 21 may be highest, the level LV25 of the lower end of the capping insulating layer 25 may be lowest, and the lower end of the intermediate insulating layer 23 may be disposed between the lower end of the via insulating layer 21 and the lower end of the capping insulating layer 25.

Vertical lengths of an inner air gap AG2 and an outer air gap AG1 may be different. A level LVAG1 of an upper end of a portion of a lower insulating layer 60 extending between the via insulating layer 21 and the intermediate insulating layer 23 may be higher than a level LVAG2 of an upper end of a portion of the lower insulating layer 60 extending between the intermediate insulating layer 23 and the capping insulating layer 25. As such, the vertical length of the inner air gap AG2 may be greater than the vertical length of the outer air gap AG1.

FIGS. 8 to 25 are cross-sectional process flowcharts explaining a method for fabricating/manufacturing a semiconductor device in accordance with some example embodiments of inventive concepts.

Figure 8:
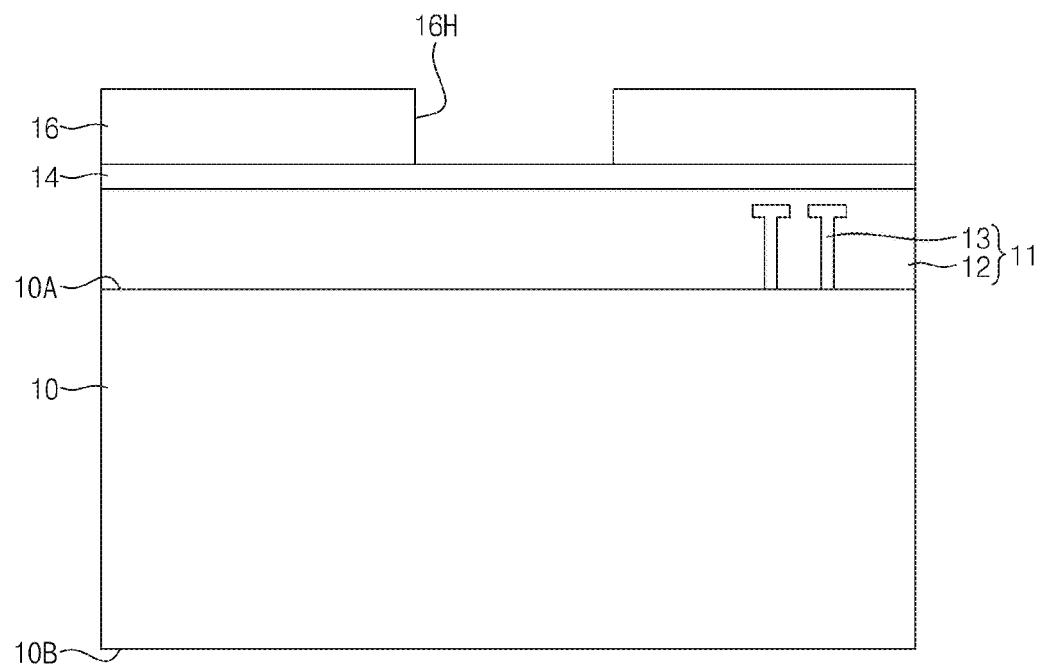
FIGS. 8 to 25 are process flowcharts explaining a method for manufacturing a semiconductor device in accordance with some example embodiments of inventive concepts.

Referring to FIG. 8, the method may include forming an interlayer insulating layer 12 and a front-end-of-line (FEOL) structure 11 including a plurality of individual devices 13 having various kinds on a semiconductor device 10, forming an etch stop layer 14 on the FEOL structure 11, and forming a mask pattern 16 on the etch stop layer 14. A hole 16H, which exposes a portion of an upper surface of the etch stop layer 14, may be formed at the mask pattern 16. For example, the etch stop layer 14 may include silicon nitride or silicon oxynitride. The etch stop layer 14 may be formed to have a thickness of about 200 to 1,000 Å, without being limited thereto. The etch stop layer 14 may be formed through a chemical vapor deposition (CVD) process such as a plasma enhanced CVD (PECVD) process and/or a low pressure CVD (LPCVD) process. The mask pattern 16 may be constituted by/correspond to a photoresist film.

Figure 9:
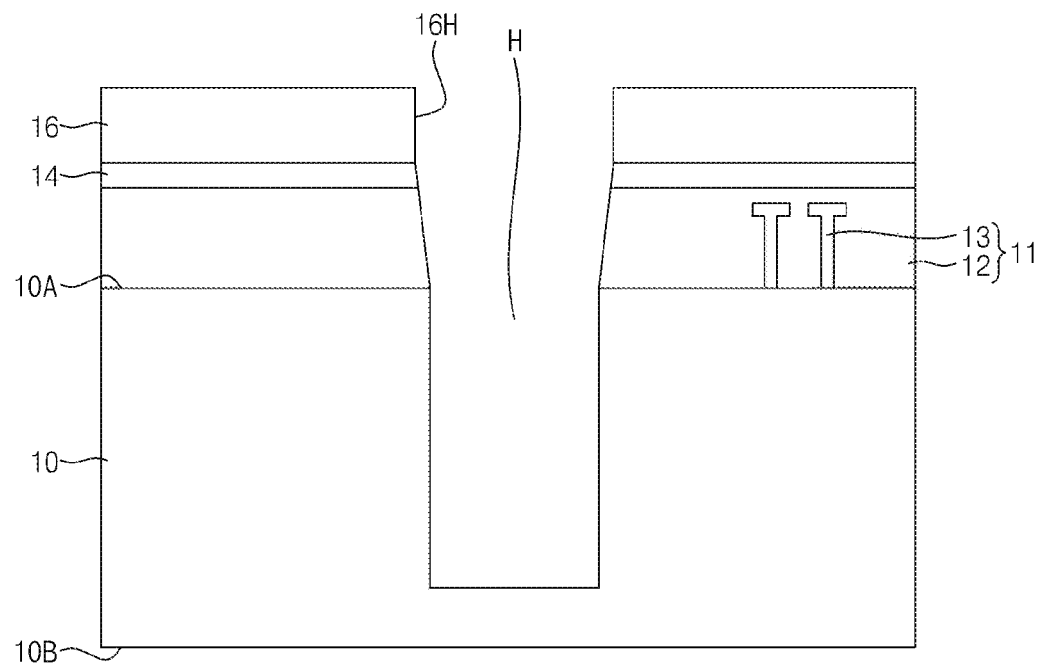

Referring to FIG. 9, the method may include forming a through hole H. Formation of the through hole H may include etching the etch stop layer 14, the interlayer insulating layer 12, and the substrate 10 using the mask pattern 16 as an etch mask. The through hole H may be formed through a Bosch process and/or laser drilling technology. For example, the through hole H may be formed to have a width of about 10 μm or less. The through hole H may be formed to have a depth of about 50 to 100 μm from an upper surface of the interlayer insulating layer 12, while a thickness of the substrate 10 may be 775 μm; however, example embodiments are not limited thereto. The width and/or depth of the through hole H are not limited to the above-described conditions, and the though hole H may be formed to have various dimensions, if necessary. After formation of the through hole H, the mask pattern 16 may be removed and, as such, the upper surface of the etch stop layer 14 may be exposed.

Figure 10:
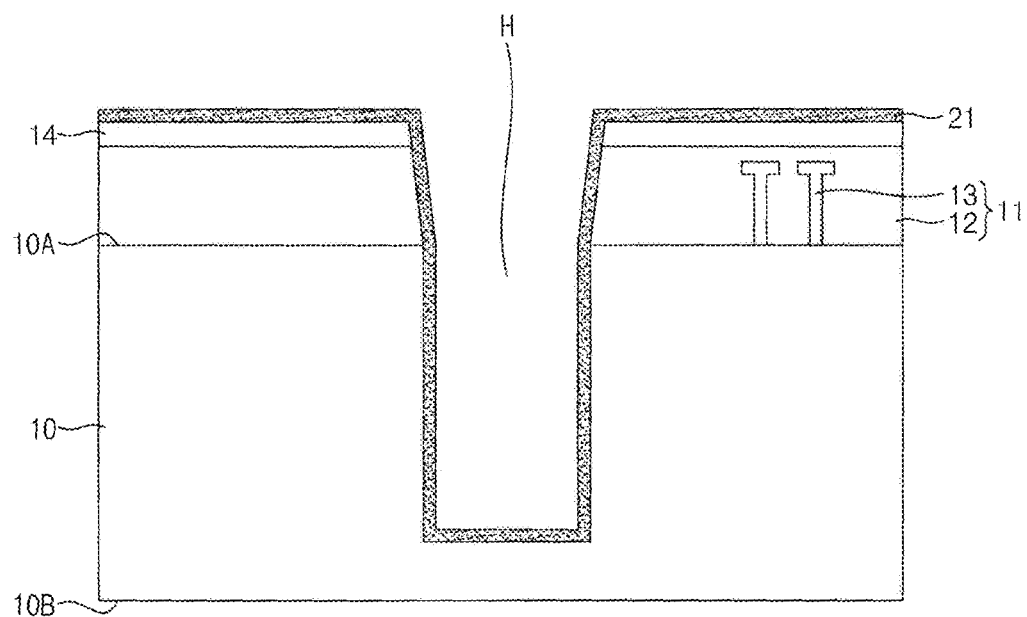

Referring now to FIG. 10, the method may include forming a via insulating layer 21 in the through hole H and on the etch stop layer 14. The via insulating layer 21 may be formed with a CVD process and/or a thermal growth process to conformally cover an inner side wall and an inner bottom surface of the substrate 10, an inner side wall of the interlayer insulating layer 12 and an inner side wall of the etch stop layer 14, which are exposed through the through hole H, and an upper surface of the etch stop layer 14. For example, the via insulating layer 21 may include either or both of an oxide and a nitride.

Figure 11:
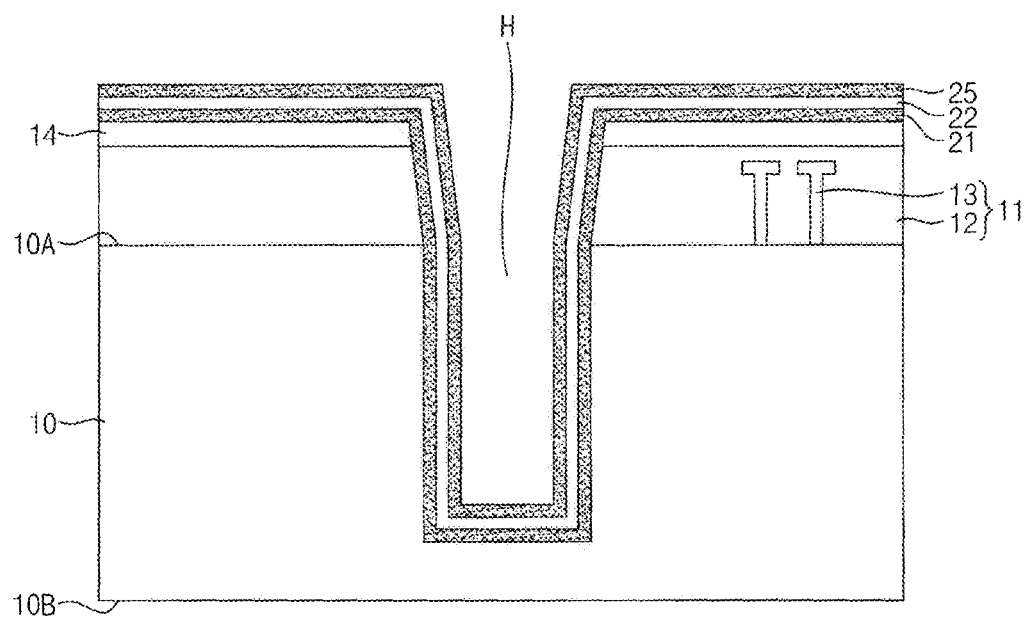

Referring to FIG. 11, the method may include forming a sacrificial insulating layer 22 on the via insulating layer 21 with, for example, a CVD process, and forming a capping insulating layer 25 on the sacrificial insulating layer 22 with, for example, a CVD process performed separately and/or in-situ with the formation of the forming of the sacrificial insulating layer 22.

The sacrificial insulating layer 22 may be formed to cover a surface of the via insulating layer 21. A material included in the sacrificial insulating layer 22 may include a material having etch selectivity with respect to, e.g. may etch slower than or faster than, the via insulating layer 21, and may include any one of an oxide, a nitride or low-k dielectrics. For example, when the via insulating layer 21 includes an oxide, the sacrificial insulating layer 22 may include a nitride, whereas, when the via insulating layer 21 includes a nitride, the sacrificial layer 22 may include a nitride or low-k dielectrics.

The capping insulating layer 25 may be formed to cover a surface of the sacrificial insulating layer 22. In some example embodiments, the capping insulating layer 25 may include the same material as the via insulating layer 21. For example, the capping insulating layer 25 may include an oxide and/or a nitride.

Thicknesses of the via insulating layer 21, the sacrificial insulating layer 22 and the capping insulating layer 25 may be equal or different. Thickness ratios among the via insulating layer 21, the sacrificial insulating layer 22 and the capping insulating layer 25 may be determined to be different, if necessary. Each of or some of the via insulating layer 21, the sacrificial insulating layer 22 and the capping insulating layer 25 may be formed through a chemical vapor deposition (CVD) process such as a plasma enhanced chemical vapor deposition (PECVD) process and/or a low pressure CVD (LPCVD) process.

Figure 12:
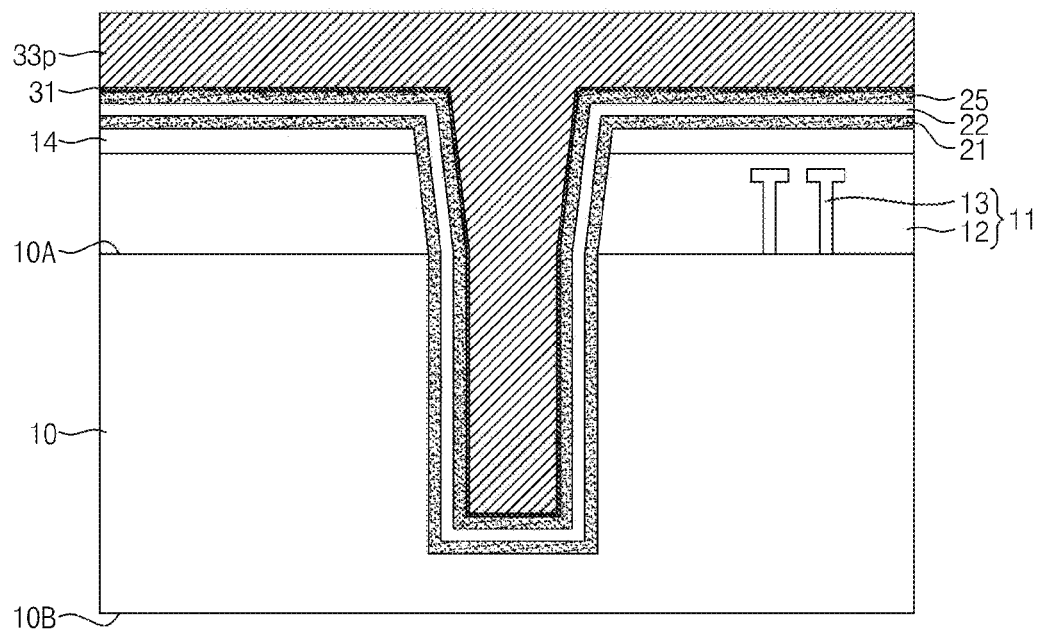

Referring to FIG. 12, the method may include forming a barrier layer 31 on the capping insulating layer 25, and forming a metal layer 33p on the barrier layer 31.

The barrier layer 31 may be formed to cover a surface of the capping insulating layer 25. The barrier layer 31 may be formed through at least one of a physical vapor deposition (PVD) process, a chemical vapor deposition (CVD) process, or an atomic layer deposition (ALD) process. The barrier layer 31 may be constituted by/included in a single-layer film made of one kind of material or a multilayer film including two kinds of materials. For example, the barrier layer 31 may include at least one material selected from W, WN, WC, Ti, TiN, Ta, TaN, Ru, Co, Mn, WN, Ni, or NiB.

The metal layer 33p may be formed to cover a surface of the barrier layer 31. The metal layer 33p may be formed not only to completely fill an inner space of the through hole H, but also to have a specific (e.g., variably determined or predetermined) thickness outside the through hole H. The metal layer 33p may be formed through an electroplating process. Formation of the metal layer 33p may be achieved by forming a seed layer on the surface of the barrier layer 31, and growing a metal film from the seed layer through an electroplating process. The seed layer may be made of at least one of Cu, a Cu alloy, Co, Ni, Ru, Co/Cu, or Ru/Cu. The seed layer may be formed through a physical vapor deposition (PVD) process; however, example embodiments are not limited thereto. The metal layer 33p may include Cu or W. The metal layer 33p may be made of Cu, CuSn, CuMg, CuNi, CuZn, CuPd, CuAu, CuW, W, or a W alloy, without being limited thereto. The electroplating process may be carried out at a temperature of about 10 to 65° C. For example, the electroplating process may be carried out at normal temperature. After formation of the metal layer 33p, the metal layer 33p may be annealed at a temperature of about 150 to 450° C., if necessary.

Figure 13:
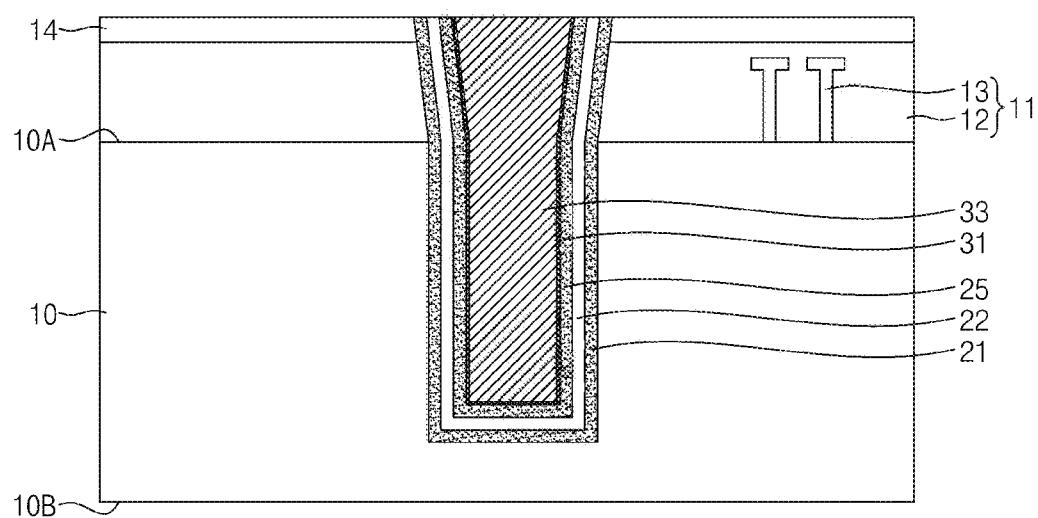

Referring to FIG. 13, the method may include forming a TSV 33. Formation of the TSV 33 may include removing upper portions of the metal layer 33p, the barrier layer 31, the capping insulating layer 25, the sacrificial insulating layer 22, and the via insulating layer 21 through a process such as chemical mechanical polishing (CMP) process, thereby exposing the etch stop layer 14. Portions of the metal layer 33p, the barrier layer 31, the capping insulating layer 25, the sacrificial insulating layer 22, and the via insulating layer 21, which are disposed outside the through hole H, may be removed and, as such, the TSV 33 may be formed in the through hole H.

Figure 14:
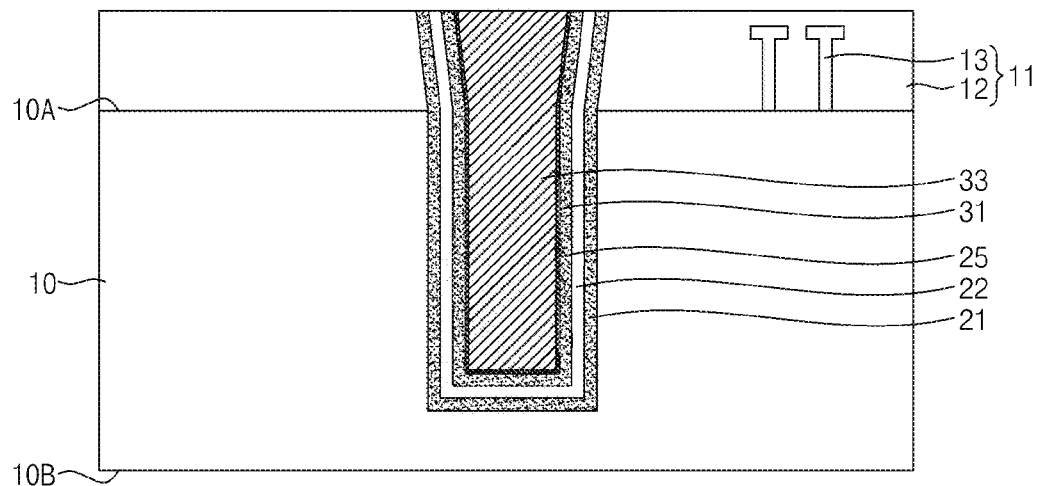

Referring to FIG. 14, the method may include thermally treating the TSV 33. The thermal treatment may be carried out at a temperature of about 400 to 500° C. Metal grains constituting/included in the TSV 33 may be grown/formed in accordance with the thermal treatment and, as such, roughness of an exposed surface of the TSV 33 may be degraded. To this end, a portion of the TSV 33 may be removed, e.g. removed through an etch-back process and/or a chemical mechanical polishing (CMP) process and, as such, an exposed surface of the TSV 33 may be planarized. The etch stop layer 14 may also be removed through the chemical mechanical polishing (CMP) process and, as such, the upper surface of the interlayer insulating layer 12 may be exposed.

Figure 15:
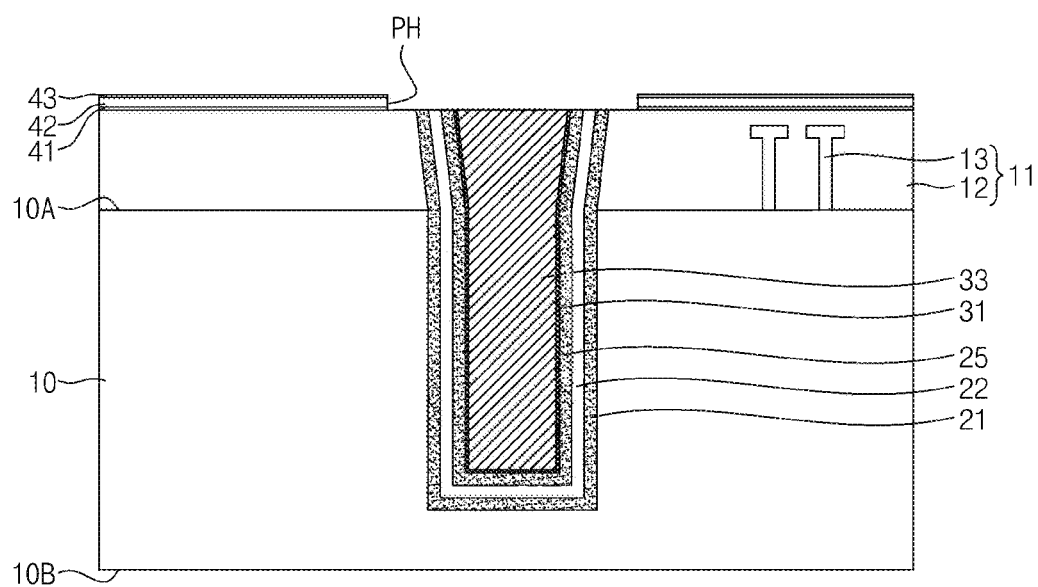
Figure 16:
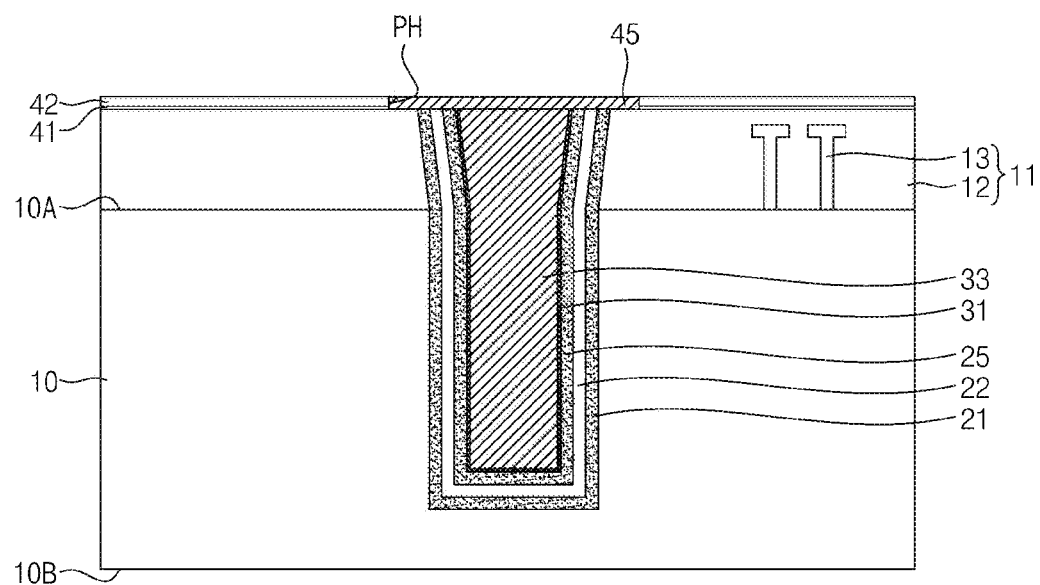
Figure 17:
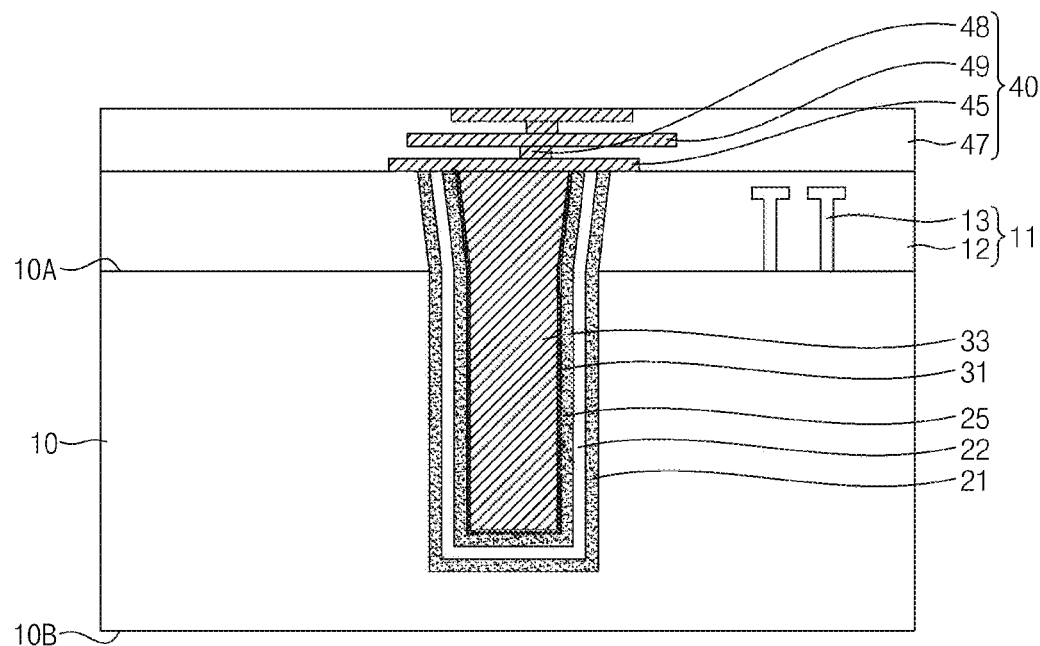

Referring to FIGS. 15, 16 and 17, the method may include forming a wiring layer 40 on the interlayer insulating layer 12. The wiring layer 40 may include a conductive pad 45, a short via 48, a wiring pattern 49, and an upper insulating layer 47.

Formation of the wiring layer 40 may include forming a plurality of insulating layers 41, 42 and 43 on the interlayer insulating layer 12, and patterning the plurality of insulating layers 41, 42 and 43, thereby forming a wiring hole PH. The plurality of insulating layers 41, 42 and 43 may include first to third insulating layers 41 to 43 sequentially stacked on the interlayer insulating layer 12. The first insulating layer 41 and the third insulating layer 43 may include silicon nitride or silicon oxynitride. The second insulating layer 42 may include silicon oxide.

Subsequently, formation of the wiring layer 40 may include forming the conductive pad 45 in the wiring hole PH. Formation of the conductive pad 45 may be achieved by forming a conductive material in the wiring hole PH and on the third insulating layer 43 with, for example, a damascene or dual-damascene process, and performing a planarization process such as a chemical mechanical polishing (CMP) process for the conductive material under the condition that the third insulating layer 43 is used as a polishing stop layer.

The third insulating layer 43 may be removed through the chemical mechanical polishing (CMP) process and, as such, the second insulating layer 42 may be exposed.

Subsequently, formation of the wiring layer 40 may include forming the short via 48, the wiring pattern 49 and an insulating layer on the second insulating layer 42 and the conductive pad 45. Formation of the short via 48, the wiring pattern 49 and the insulating layer may be similar to the process of forming the conductive pad 45 as described in conjunction with FIGS. 15 and 16. For example, formation of the short via 48 and/or the wiring layer 40 may be achieved by forming an insulating layer having a hole, and filling the hole with a conductive material. As the short via 48 and the wiring pattern 49 are alternately repeatedly formed, the short via 48 and the wiring pattern 49 may be alternately stacked on the conductive pad 45. As insulating layers formed in procedures of forming the conductive pad 45, the short via 48 and the wiring pattern 49 are stacked, the upper insulating layer 47 may be formed. For example, each of the short via 48 and the wiring pattern 49 may include at least one of W, Al or Cu, and may or may not include the same material.

Figure 18:
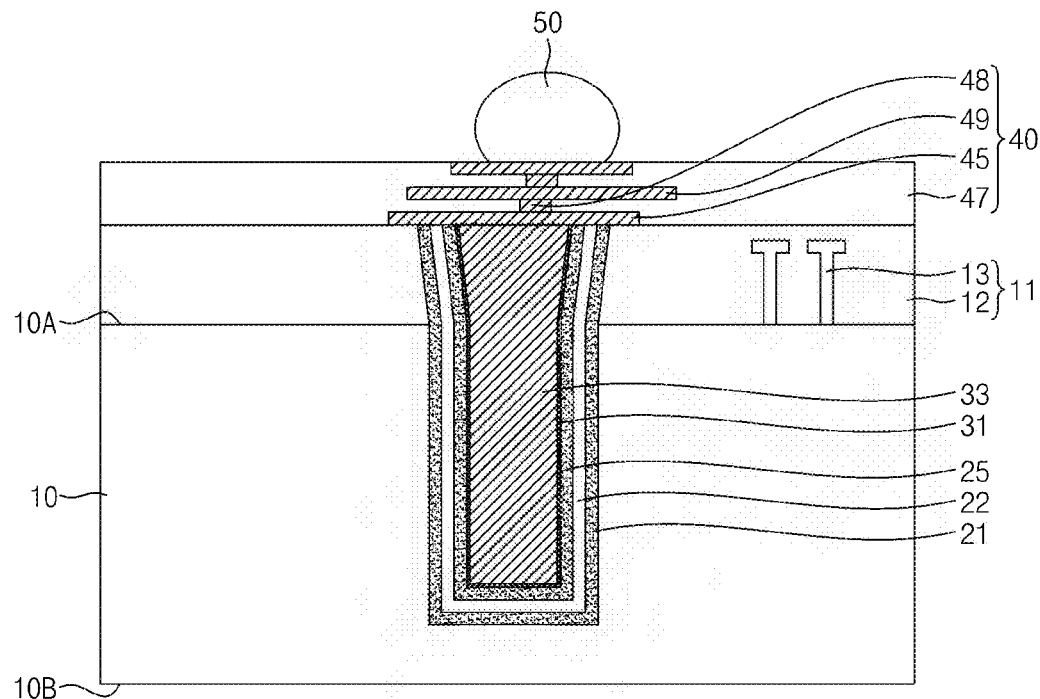

Referring now to FIG. 18, the method may include forming a connecting terminal 50 on the wiring layer 40. The connecting terminal 50 may be or include a solder ball, without being limited thereto.

Figure 19:
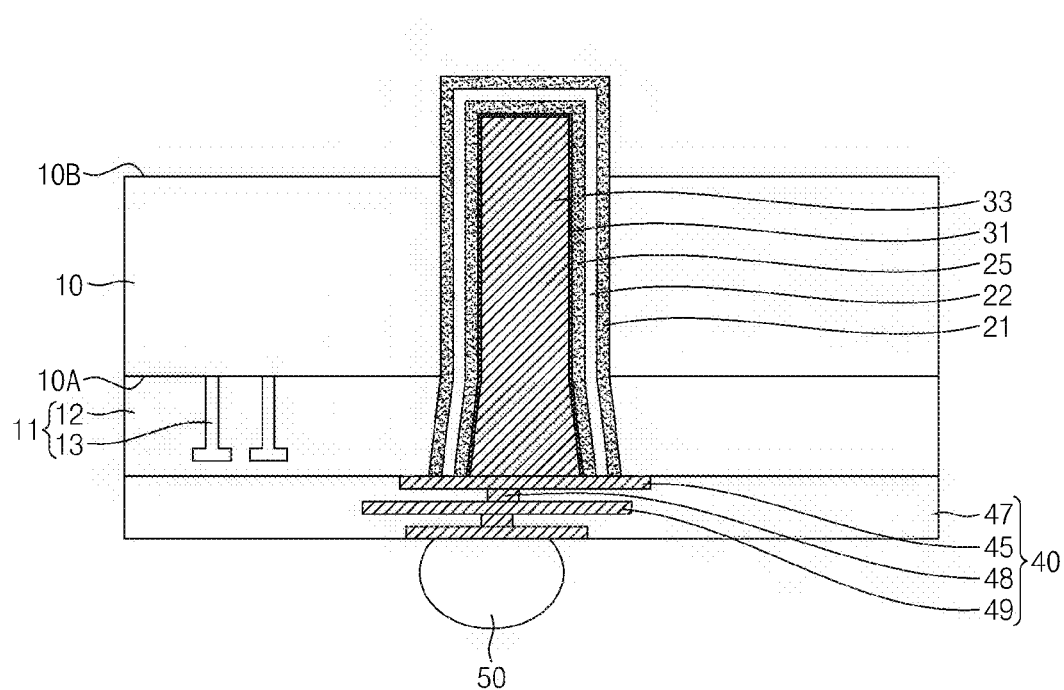

Referring to FIG. 19, the method may include partially removing the substrate 10, thereby causing the TSV 33 to protrude from the substrate 10. The substrate 10 may be partially removed from a lower surface of the substrate 10 in an inverted state of the substrate 10. The substrate 10 may be partially removed with an etching process such as a wet-etching process and/or a dry-etching process. As the substrate 10 is partially removed, a surface of the via insulating layer 21 is partially exposed, and portions of the TSV 33, the barrier layer 31, the via insulating layer 21, the sacrificial insulating layer 22 and the capping insulating layer 25 may protrude from a lower surface 10B of the substrate 10. As the substrate 10 is partially removed, the exposed via insulating layer 21 may also be partially removed.

Figure 20:
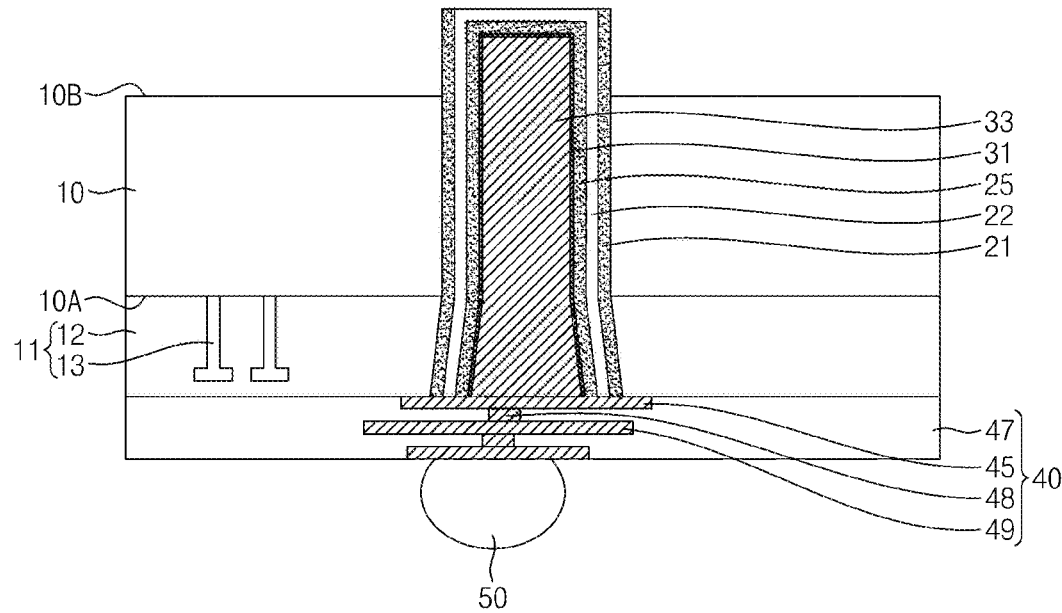

Referring to FIG. 20, the method may include partially removing the via insulating layer 21, thereby exposing the sacrificial layer 22. The via insulating layer 21 may be removed until a lower surface of the sacrificial insulating layer 22 is exposed. In some example embodiments, when the substrate 10 is partially removed, the via insulating layer 21 may be partially removed together with the substrate 10, thereby exposing the sacrificial insulating layer 22. In this case, the process of partially removing the via insulating layer 21, which is a process separate from the process of partially removing the substrate 10, may be omitted.

Figure 21:
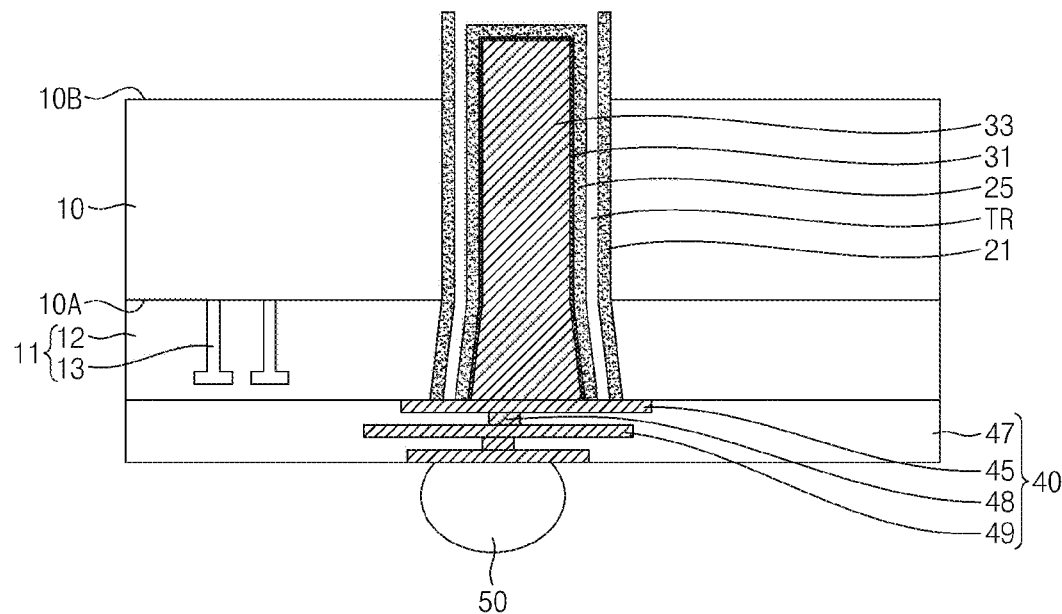

Referring to FIG. 21, the method may include removing the sacrificial insulating layer 22, thereby forming a trench TR. The trench TR may be formed between the via insulating layer 21 and the capping insulating layer 25 through removal of the sacrificial insulating layer 22. For example, when the sacrificial insulating layer 22 is an oxide, the sacrificial insulating layer 22 may be removed using a Limulus amoebocyte lysate (LAL) lift-off process or a chemical oxide removal (COR) process. For example, when the sacrificial insulating layer 22 is a nitride, the sacrificial insulating layer 22 may be removed through a phosphoric acid strip process. In some example embodiments, the sacrificial insulating layer 22 may be incompletely removed and, as such, at least some portions thereof may remain around the conductive pad 45.

Figure 22:
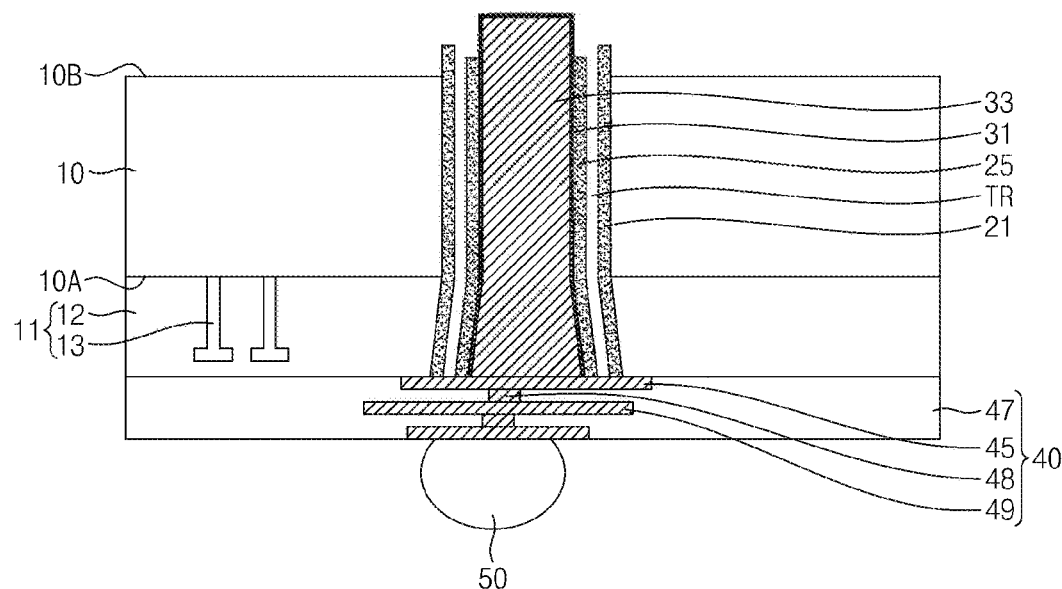

Referring to FIG. 22, the method may include partially removing the capping insulating layer 25, thereby exposing the barrier layer 31. As the capping insulating layer 25 is removed, at least portions of the via insulating layer 21 may also be removed and, as such, the height of a lower end of the via insulating layer 21, which is disposed on the lower surface 10B of the substrate 10 may be lowered. The via insulating layer 21 and the capping insulating layer 25 may be removed, e.g. removed with a wet etching process until levels of lower ends thereof become lower than the level of a lower end of the TSV 33. As such, the height of the trench TR may be lowered. The lower ends of the via insulating layer 21 and the capping insulating layer 25 may be disposed at a higher level than the lower surface 10B of the substrate 10. For example, lower portions of the via insulating layer 21 and the capping insulating layer 25 may protrude from the lower surface 10B of the substrate 10.

Figure 23:
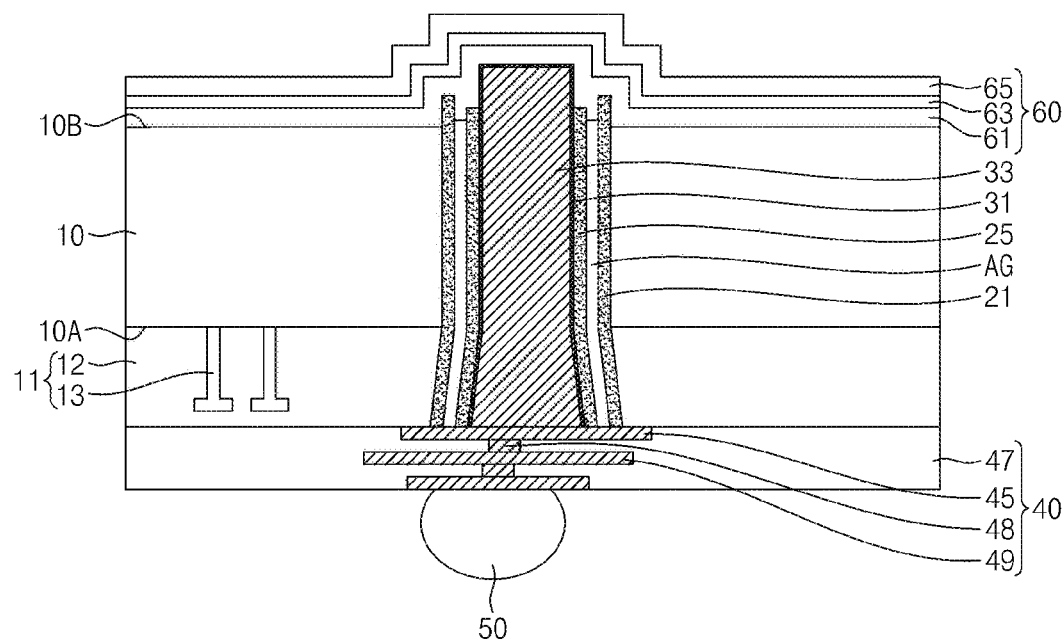

Referring to FIG. 23, the method may include forming a lower insulating layer 60 including a capping layer 61, a support layer 63 and a passivation layer 65 on the lower surface 10B of the substrate 10. Formation of the lower insulating layer 60 may include sequentially forming the capping layer 61, the support layer 63 and the passivation layer 65 on the lower surface 10B of the substrate 10. Upon forming the lower insulating layer 60, an air gap AG may be formed. The air gap AG may be formed under pressure; however, example embodiments are not limited thereto. Further the air gap AG may include air such as clean, dry air; however, example embodiments are not limited thereto.

The capping layer 61 may be formed to cover an exposed surface of the substrate 10 and a surface of the barrier layer 31 protruding from the substrate 10. The capping layer 61 may seal the trench TR while covering the exposed via insulating layer 21 and the exposed capping insulating layer 25. A portion of the capping layer 61 may extend between the via insulating layer 21 and the capping insulating layer 25 and, as such, may have a shape protruding from the capping layer 61. For example, the capping layer 61 may include silicon oxide.

The support layer 63 may be formed to cover a surface of the capping layer 61. The support layer 63 may function to support the TSV 33 protruding from the substrate 10 in order to prevent or reduce the likelihood of the TSV 33 from being bent in a chemical mechanical polishing (CMP) process. For example, the support layer 63 may include silicon nitride. The passivation layer 65 may be formed to cover a surface of the support layer 63. For example, the passivation layer 65 may include silicon oxide. The capping layer 61, the support layer 63, and the passivation layer 65 may be formed through a chemical vapor deposition (CVD) process such as a PECVD process and/or an LPCVD process and/or an ALD process.

Figure 24:
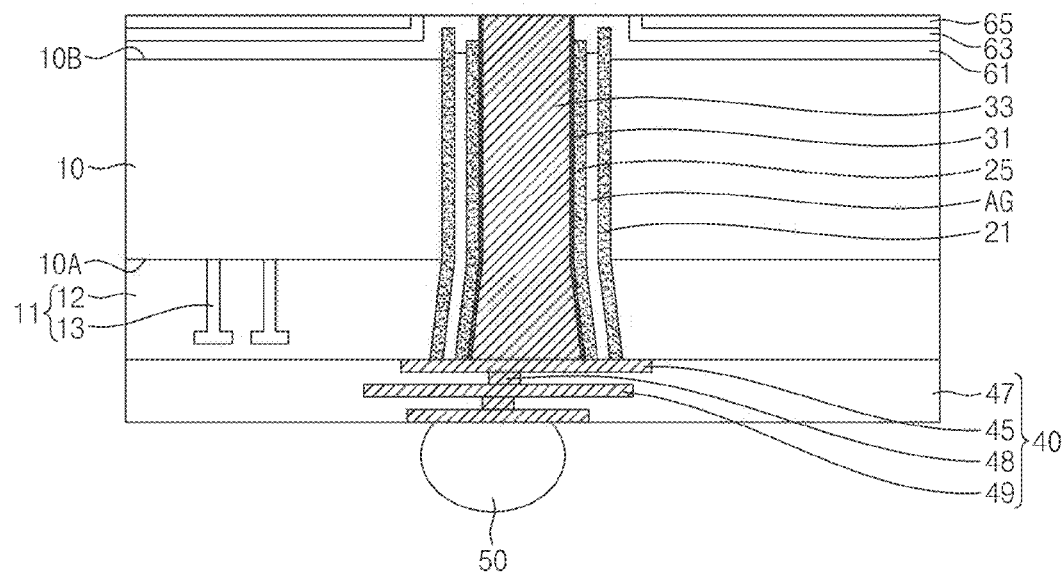

Referring to FIG. 24, the method may include polishing and/or etching back the lower insulating layer 60, thereby planarizing an exposed surface of the lower insulating layer 60. The barrier layer 31 and the TSV 33 may be exposed by the polishing process. In addition, the support layer 63 and the capping layer 61 may be exposed by the polishing process.

Figure 25:
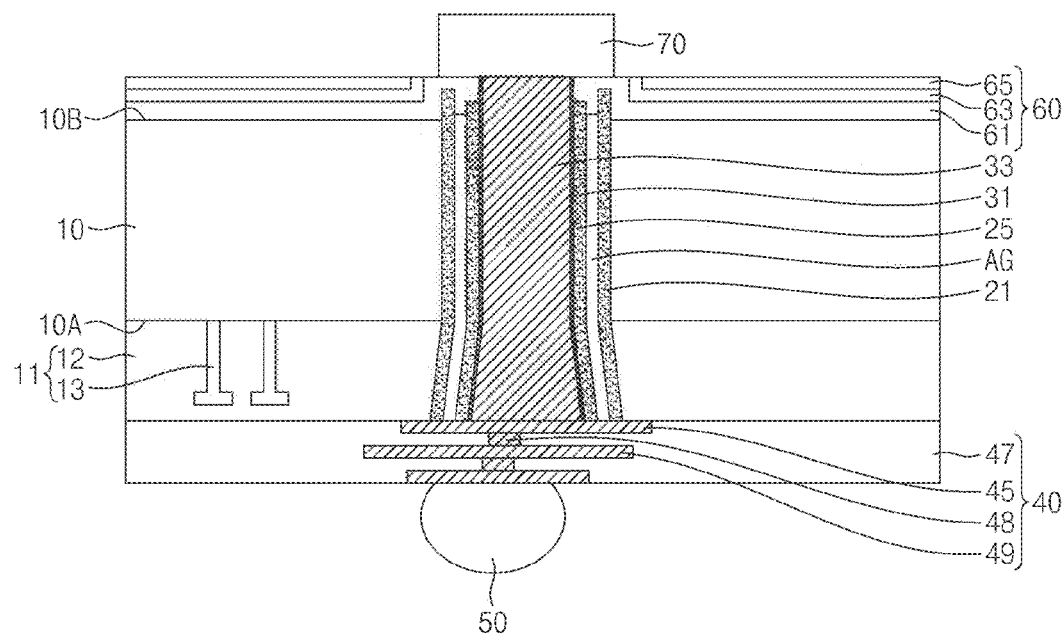

Referring to FIG. 25, the method may include forming a conductive layer 70 connected to the TSV 33 on the lower insulating layer 60. The conductive layer 70 may be formed through electroplating under the condition that a seed layer is provided on the TSV 33. The conductive layer 70 may be made of Ti, Cu, Ni, Au, NiV, NiP, TiNi, TiW, TaN, Al, Pd, CrCu, or a combination thereof. For example, the conductive layer 70 may be constituted by/included in a stacked structure of Cr/Cu/Au, a stacked structure of Cr/CrCu/Cu, a TiWCu compound, a stacked structure of TiWCu/Cu, a stacked structure of Ni/Cu, a stacked structure of NiV/Cu, a stacked structure of Ti/Ni, a stacked structure of Ti/NiP, a TiWNiV compound, a stacked structure of Al/Ni/Au, a stacked structure of Al/NiP/Au, a stacked structure of Ti/TiNi/CuNi compounds, a stacked structure of Ti/Ni/Pd, a stacked structure of Ni/Pd/Au, or a stacked structure of NiP/Pd/Au. In some example embodiments, the conductive layer 70 may be a stacked structure of Ti/Cu/Ni/Au.

FIGS. 26 to 36 are process flowcharts explaining a method for manufacturing/fabricating a semiconductor device in accordance with some example embodiments of inventive concepts.

Figure 26:
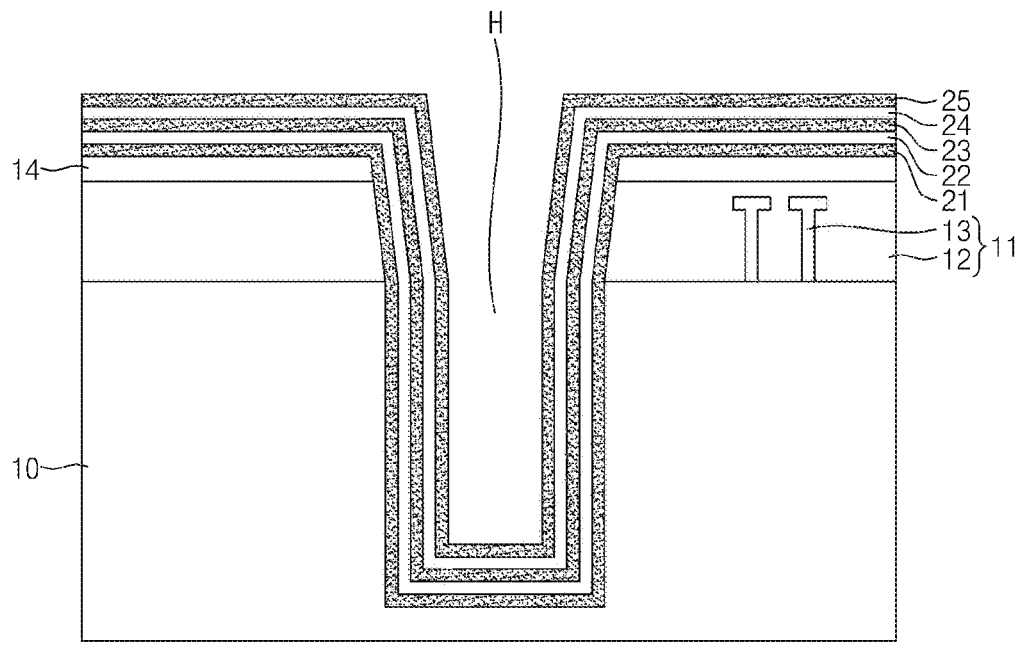
FIGS. 26 to 36 are process flowcharts explaining a method for manufacturing a semiconductor device in accordance with some example embodiments of inventive concepts.

Referring to FIG. 26, the method may include forming a via insulating layer 21, a first sacrificial insulating layer 22, an intermediate insulating layer 23, a second sacrificial insulating layer 24 and a capping insulating layer 25 on a substrate 10 through sequential stacking thereof after formation of a through hole H extending through the substrate 10 and an interlayer insulating layer 12 by the processes described in conjunction with FIGS. 8 and 9.

In some example embodiments, the via insulating layer 21, the intermediate insulating layer 23 and the capping insulating layer 25 may be made of, e.g. may include or consist of, the same material or materials. The first sacrificial insulating layer 22 and the second sacrificial insulating layer 24 may be made of, e.g. may include or consists of, the same material or materials. Each of the via insulating layer 21, the intermediate insulating layer 23, and the capping insulating layer 25 may include a material different from those of the first sacrificial insulating layer 22 and the second sacrificial insulating layer 24. Each of the via insulating layer 21, the intermediate insulating layer 23, and the capping insulating layer 25 may be made of a material having etch selectivity with respect to each of the first sacrificial insulating layer 22 and the second sacrificial insulating layer 24. For example, each of the via insulating layer 21, the intermediate insulating layer 23 and the capping insulating layer 25 may be, include, or consist of silicon oxide and/or silicon nitride. Each of the first sacrificial insulating layer 22 and the second sacrificial insulating layer 24 may be, include, or consist of silicon oxide, silicon nitride, or low-k dielectrics.

Figure 27:
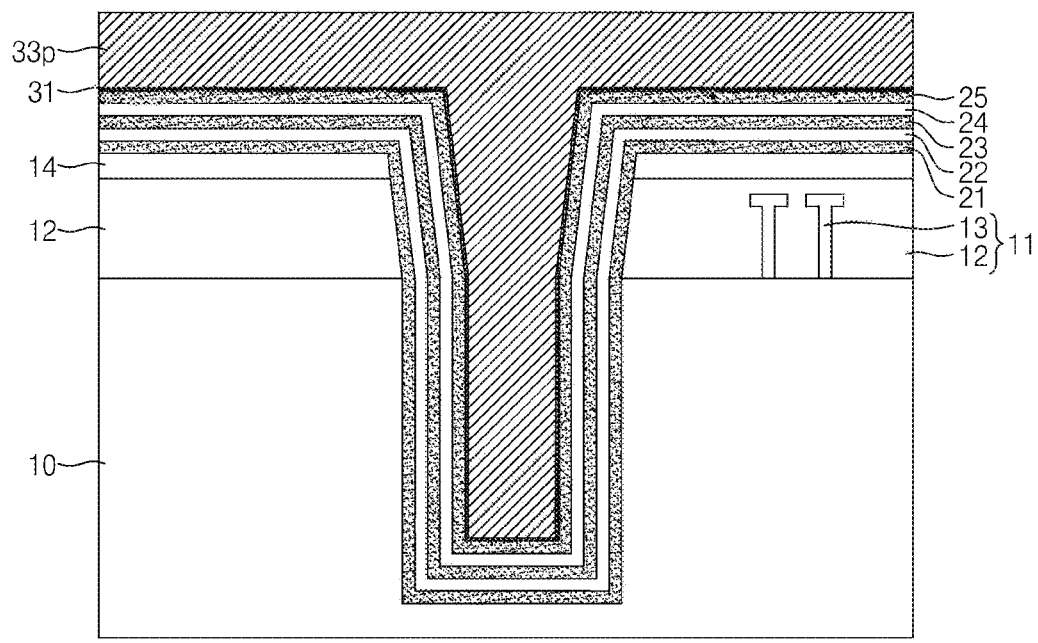

Referring to FIG. 27, the method may include forming a barrier layer 31 on the capping insulating layer 25, and forming a metal layer 33p on the barrier layer 31.

Figure 28:
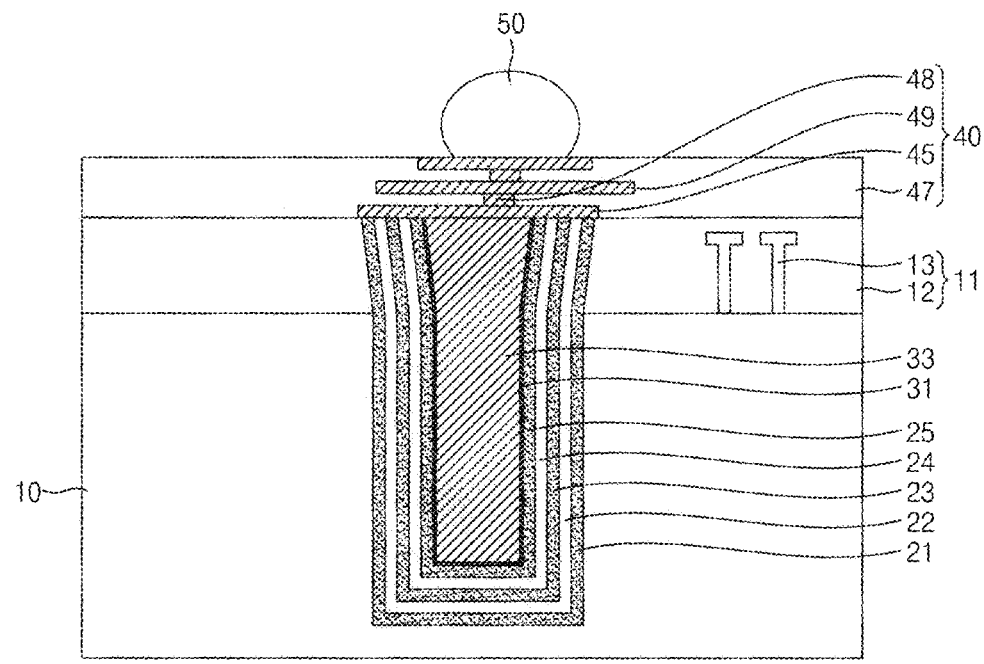

Referring to FIG. 28, the method may include forming a TSV 33, a wiring layer 40 and a connecting terminal 50 through processes identical or similar to the processes described in conjunction with FIGS. 13 to 18.

Figure 29:
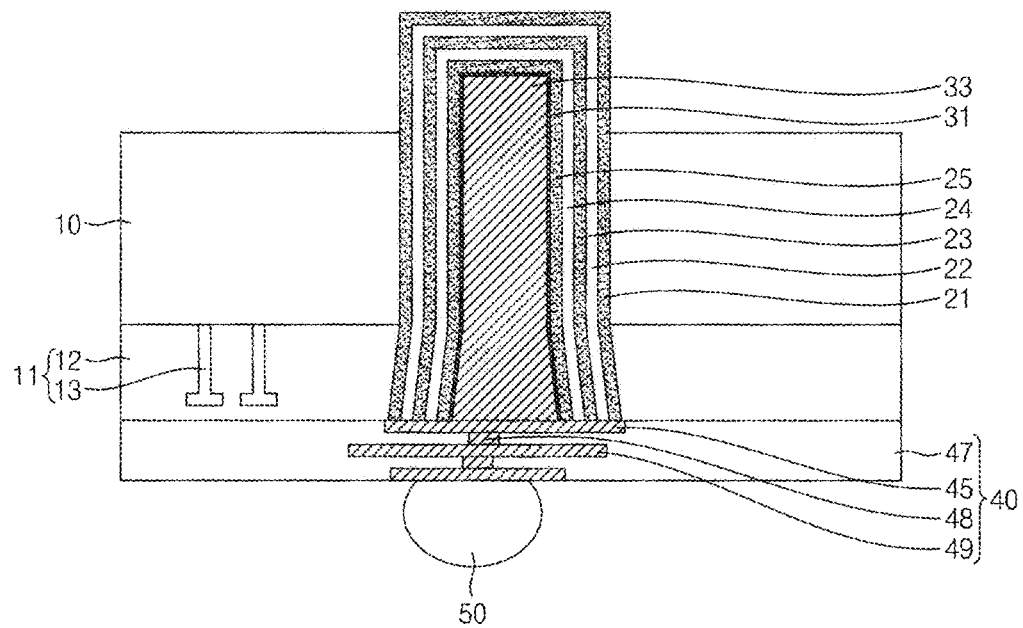

Referring to FIG. 29, the method may include partially removing the substrate 10, thereby causing the TSV 33 to protrude from a lower surface of the substrate 10. Through partial removal of the substrate 10 from the lower surface of the substrate 10 in an inverted state of the substrate 10, a portion of a surface of the via insulating layer 21 may be exposed, and lower portions of the TSV 33, the barrier layer 31, the capping insulating layer 25, the second sacrificial insulating layer 24, the intermediate insulating layer 23, the first sacrificial insulating layer 22 and the via insulating layer 21 may protrude from the lower surface of the substrate 10.

Figure 30:
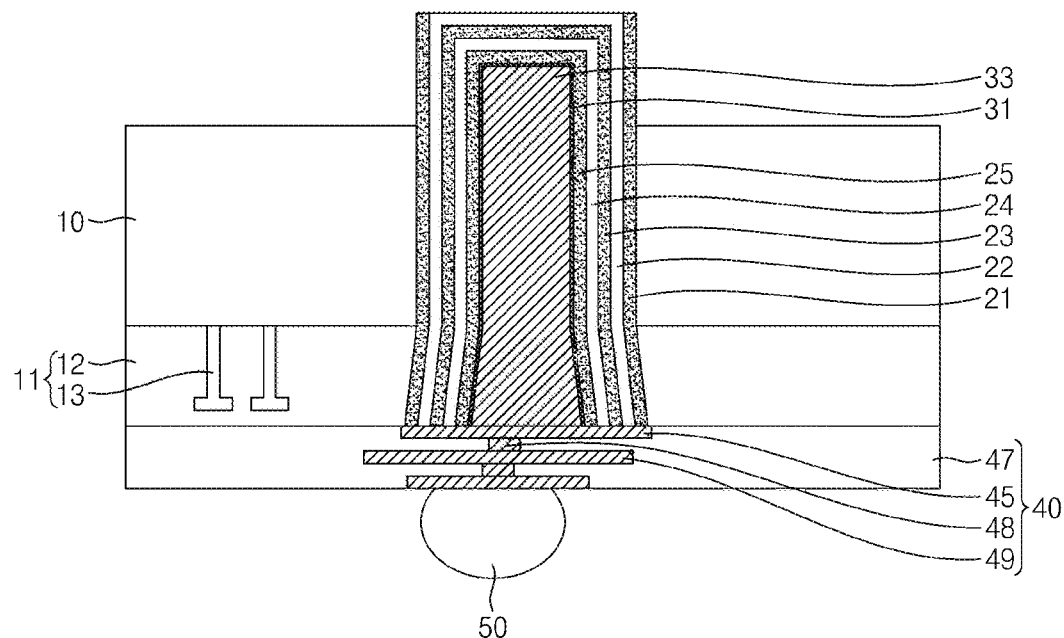

Referring to FIG. 30, the method may include partially removing the via insulating layer 21, thereby exposing the first sacrificial insulating layer 22. The via insulating layer 21 may be removed until a lower surface of the first sacrificial insulating layer 22 is exposed. In some example embodiments, when the substrate 10 is partially removed/ etched, as shown in FIG. 29, the via insulating layer 21 is also removed/etched and, as such, the first sacrificial insulating layer 22 may also be exposed. In this case, the process of partially removing the via insulating layer 21, which is a process separate from the process of partially removing the substrate 10, may be omitted.

Figure 31:
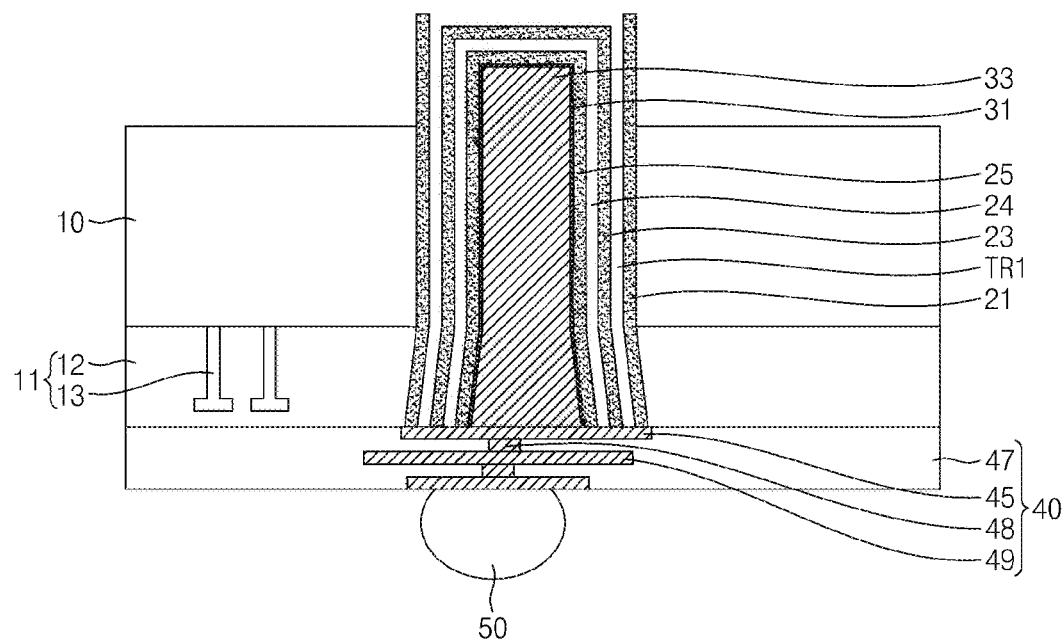

Referring to FIG. 31, the method may include removing the first sacrificial insulating layer 22, thereby forming a first trench TR1. For example, when the first sacrificial insulating layer 22 is an oxide, the first sacrificial insulating layer 22 may be removed using a Limulus amoebocyte lysate (LAL) lift-off process or a chemical oxide removal (COR) process. For example, when the first sacrificial insulating layer 22 is a nitride, the first sacrificial insulating layer 22 may be removed through a wet etching process, such as a phosphoric acid stripping process.

Figure 32:
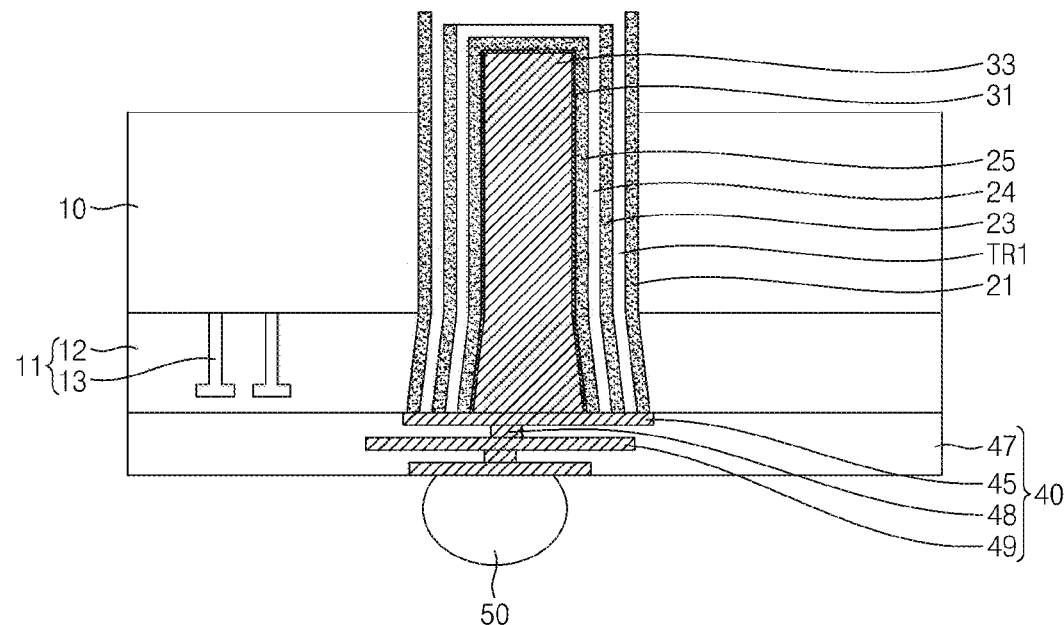

Referring to FIG. 32, the method may include partially removing the intermediate insulating layer 23, thereby exposing the second sacrificial insulating layer 24. The intermediate insulating layer 23 may be removed until a lower surface of the second sacrificial insulating layer 24 is exposed. As the intermediate insulating layer 23 is removed, a portion of the via insulating layer 21, which includes the same material as the intermediate insulating layer 23, may also be etched, e.g. wet etched.

Figure 33:
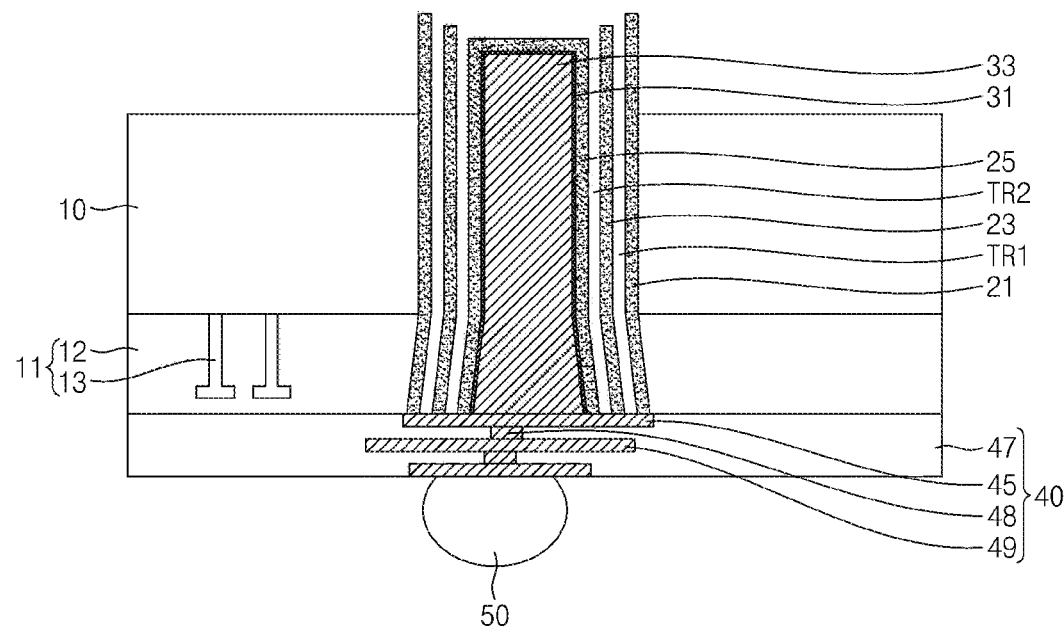

Referring to FIG. 33, the method may include removing the second sacrificial insulating layer 24, thereby forming a second trench TR2. Through removal of the second sacrificial insulating layer 24, the second trench TR2 may be formed between the intermediate insulating layer 23 and the capping insulating layer 25. The second sacrificial insulating layer 24 may be removed through the same process as the process of removing the first sacrificial insulating layer 22.

Figure 34:
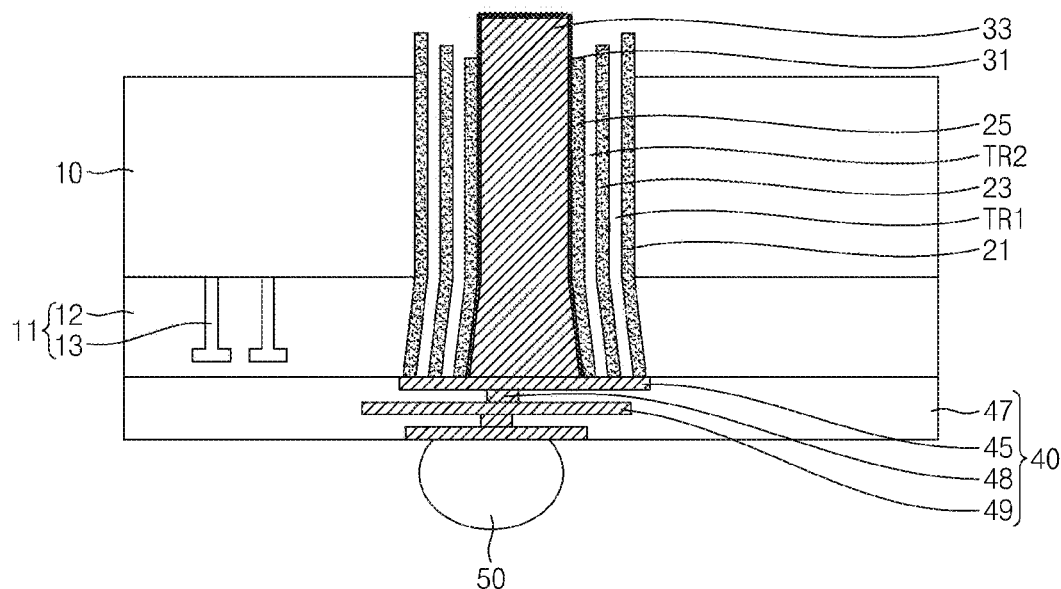

Referring to FIG. 34, the method may include partially removing the capping insulating layer 25, thereby exposing the barrier layer 31. As the capping insulating layer 25 is removed, the via insulating layer 21 and the intermediate insulating layer 23 may also be removed and, as such, heights of lower ends of the via insulating layer 21 and the intermediate insulating layer 23 may be lowered.

Figure 35:
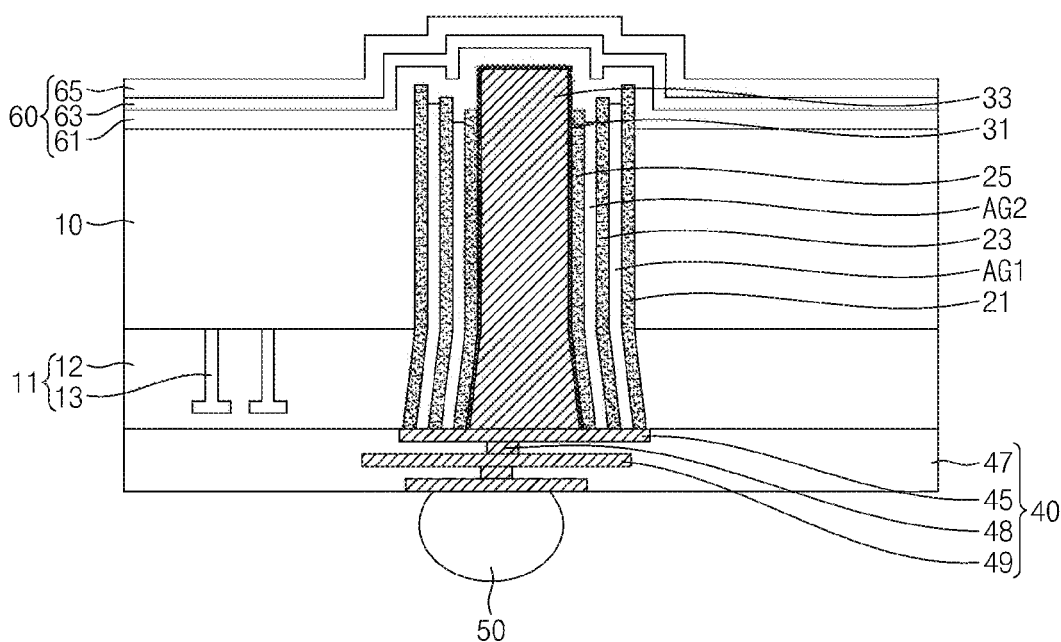

Referring to FIG. 35, the method may include forming a lower insulating layer 60. Formation of the lower insulating layer 60 may include sequentially forming a capping layer 61, a support layer 63 and a passivation layer 65 on the lower surface of the substrate 10.

The capping layer 61 may be formed to cover an exposed surface of the substrate 10 and a surface of the barrier layer 31 protruding from the substrate 10. The capping layer 61 may seal the first trench TR1 and the second trench TR2 while covering the exposed via insulating layer 21, the exposed intermediate insulating layer 23 and the exposed capping insulating layer 25, thereby forming a first air gap AG1 and a second air gap AG2. A portion of the capping layer 61 may extend between the via insulating layer 21 and the intermediate insulating layer 23 and, as such, may seal the first trench TR1, thereby forming the first air gap AG1. Another portion of the capping layer 61 may extend between the intermediate insulating layer 23 and the capping insulating layer 25 and, as such, may seal the second trench TR2, thereby forming the second air gap AG2. The first air gap AG1 and/or the second air gap AG2 may be formed in a vacuum; however, example embodiments are not limited thereto. A pressure in the first air gap AG1 and/or the second air gap AG2 may be less than atmospheric pressure; however, example embodiments are not limited thereto.

Figure 36:
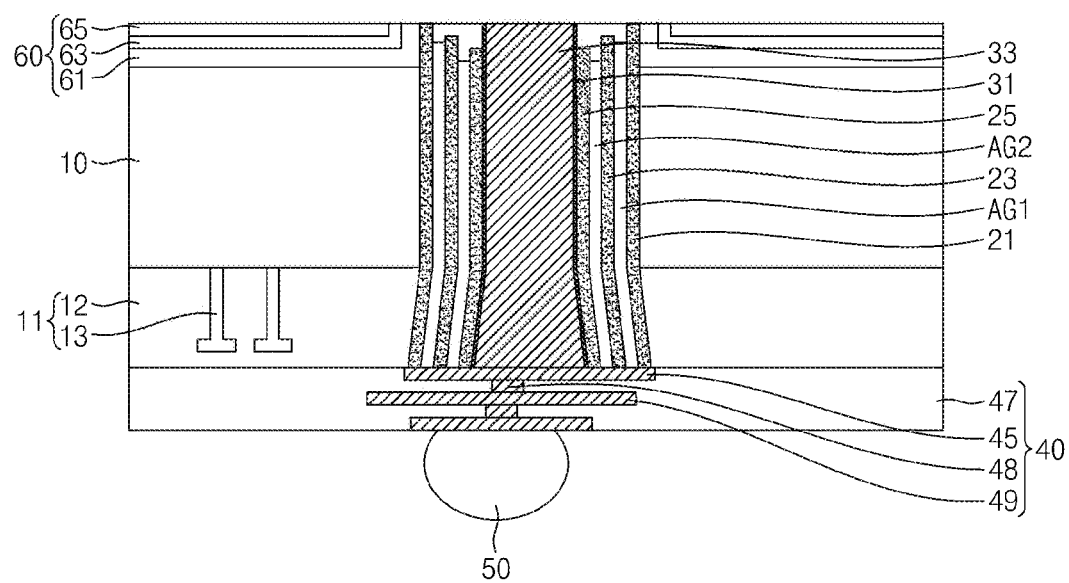

Referring to FIG. 36, the method may include etching and/or polishing the lower insulating layer 60, thereby planarizing an exposed surface of the lower insulating layer 60. The barrier layer 31 and the TSV 33 may be exposed by the polishing process. In addition, the support layer 63 and the capping layer 61 may be exposed by the polishing process.

Subsequently, referring to FIG. 4A, the method may include forming, on the lower insulating layer 60, a conductive layer 70 connected to the TSV 33.

Figure 37:
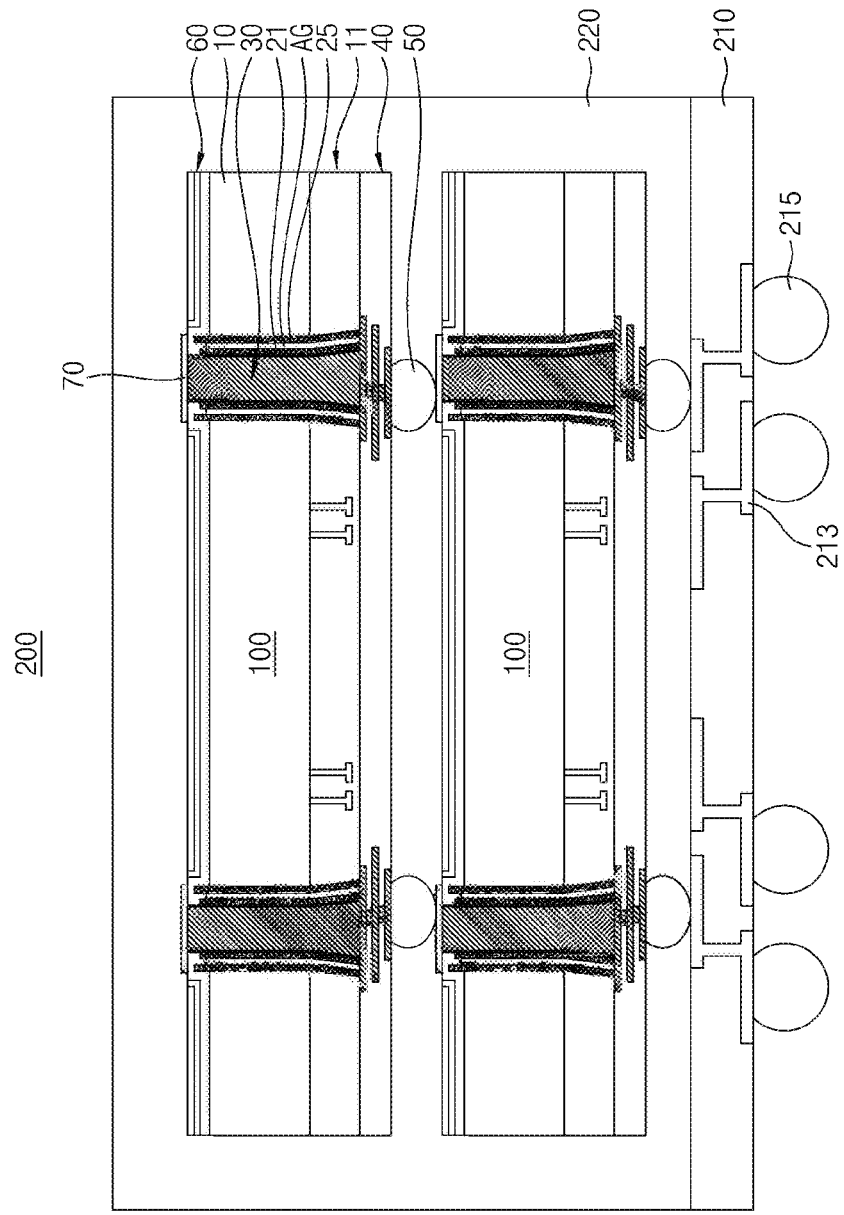
FIG. 37 is a sectional view of a semiconductor package according to some example embodiments of inventive concepts.

FIG. 37 is a sectional view of a semiconductor package according to some example embodiments of inventive concepts.

Referring to FIG. 37, a semiconductor package 200 may include a package substrate 210, and at least one semiconductor chip 100 mounted on the package substrate 210. Although two semiconductor chips 100 are shown in the drawing as being stacked, various numbers of stacked semiconductor chips 100 may be used, for example, 4, 8, 16, etc.

The package substrate 210 may be a printed circuit board including a wiring structure 213 therein. External connecting terminals 215 electrically connected to the wiring structure 213 may be disposed at the package substrate 210. The external connecting terminals 215 may electrically connect the wiring structure 213 to an external device. For example, the external connecting terminal may be solder balls, without being limited thereto.

The package substrate 210 and the semiconductor chips 100 may be electrically connected to each other through TSV structures 30 and connecting terminals 50. Alternatively or additionally, adjacent ones of the semiconductor chips 100 may be electrically connected to each other through the TSV structures 30, the connecting terminals 50 and a conductive layer 70.

The semiconductor chip 100 of FIG. 37 may include the constituent elements described in conjunction with FIG. 1A. Although the semiconductor package 200 is shown in FIG. 37 as including the constituent elements described in conjunction with FIG. 1A, the semiconductor package 200 may include the constituent elements described in conjunction with FIG. 3A, 4A or 7A.

In accordance with some example embodiments, an insulating film including an air gap having permittivity approximate to 1 between a TSV and a substrate. The TSV may have improved/excellent insulation characteristics with respect to the substrate by virtue of the air gap. Alternatively or additionally, an insulating film and/or an air gap surrounding the TSV may be provided in plural and, as such, damage to the insulating film or degradation of the insulating film may be avoided or reduced in likelihood of occurrence. Alternatively or additionally, a break-down voltage (BV) of the TSV may be maintained, and/or parasitic capacitance thereof may be reduced. Accordingly, a semiconductor device having improved reliability may be provided.

While some example embodiments of inventive concepts have been described with reference to the accompanying drawings, it should be understood by those of ordinary skill in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:
an interlayer insulating layer covering an upper surface of a substrate;
an individual device in the interlayer insulating layer;
a lower insulating layer covering a lower surface of the substrate;
a through-silicon-via (TSV) structure extending through the substrate, extending through the interlayer insulating layer, and extending through the lower insulating layer;
a conductive pad connected to an upper end of the TSV structure;
a via insulating layer surrounding the TSV structure;
a capping insulating layer surrounding the TSV structure inside the via insulating layer; and
an air gap,
wherein the air gap contacts a surface of the via insulating layer and a surface of the capping insulating layer,
the lower insulating layer extends between the via insulating layer and the capping insulating layer,
a portion of the air gap extends into the lower insulating layer, and
a vertical length of the via insulating layer and a vertical length of the capping insulating layer are different.

2. The semiconductor device according to claim 1, wherein the via insulating layer and the capping insulating layer are spaced apart from each other.

3. The semiconductor device according to claim 1, wherein the via insulating layer extends into the lower insulating layer.

4. The semiconductor device according to claim 1, wherein the capping insulating layer extends into the lower insulating layer.

5. The semiconductor device according to claim 1, wherein lower ends of the via insulating layer and the capping insulating layer are between the lower surface of the substrate and a lower end of the TSV structure.

6. The semiconductor device according to claim 1, wherein each of the via insulating layer and the capping insulating layer comprises silicon nitride.

7. The semiconductor device according to claim 1, wherein
the TSV structure comprises:
a TSV; and
a barrier layer surrounding the TSV, and
the lower insulating layer surrounds an outer side surface of the barrier layer.

8. The semiconductor device according to claim 1, further comprising:
an intermediate insulating layer between the via insulating layer and the capping insulating layer,
wherein the air gap includes a first air gap and a second air gap, the first air gap is between the via insulating layer and the intermediate insulating layer and the second air gap is between the intermediate insulating layer and the capping insulating layer.

9. The semiconductor device of claim 1, wherein the lower insulating layer comprises silicon oxide.

10. The semiconductor device of claim 1, wherein the air gap is in direct contact with an outer surface of the capping insulating layer and an inner surface of the via insulating layer.

11. The semiconductor device of claim 1, wherein an upper end of the air gap is defined by the conductive pad.

12. The semiconductor device of claim 1, wherein
a level of a lower end of the via insulating layer is lower than a level of a lower end of the capping insulating layer,
wherein the level of a lower end of the via insulating layer is lower than a level of the lower end of the air gap.

13. A semiconductor device comprising:
an interlayer insulating layer covering an upper surface of a substrate;
an individual device in the interlayer insulating layer;
a lower insulating layer covering a lower surface of the substrate;
a through-silicon-via (TSV) structure extending through the substrate, extending through the interlayer insulating layer, and extending through the lower insulating layer;
a conductive pad connected to an upper end of the TSV structure;
a via insulating layer surrounding the TSV structure;
a capping insulating layer surrounding the TSV structure, the capping insulating layer inside the via insulating layer;
an intermediate insulating layer between the via insulating layer and the capping insulating layer;
a first air gap; and
a second air gap,
wherein the first air gap contacts a surface of the via insulating layer and a surface of the intermediate insulating layer,
the second air gap contacts another surface of the intermediate insulating layer and a surface of the capping insulating layer, and
vertical lengths of the first air gap and the second air gap are different.

14. The semiconductor device according to claim 13, wherein horizontal widths of the first air gap and the second air gap are different.

15. The semiconductor device of claim 13, wherein a lower end of the first air gap is between a bottom surface of the capping insulating layer and a bottom surface of the via insulating layer.

* * * * *